US012725639B2

(12) United States Patent
Kraman et al.

(10) Patent No.: US 12,725,639 B2
(45) Date of Patent: Sep. 1, 2026

(54) NON-VOLATILE MEMORY ARRAY WITH INTEGRATED MEMORY AND ACCESS TRANSISTORS AND METHOD OF MAKING THE SAME

(71) Applicant: Sandisk Technologies, Inc., Milpitas, CA (US)

(72) Inventors: Mark Kraman, San Jose, CA (US); Kartik Sondhi, Milpitas, CA (US); Peng Zhang, Fremont, CA (US); Johann Alsmeier, San Jose, CA (US); Senaka Kanakamedala, San Jose, CA (US); Yan Li, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 176 days.

(21) Appl. No.: 18/827,036

(22) Filed: Sep. 6, 2024

(65) Prior Publication Data

US 2026/0073951 A1 Mar. 12, 2026

(51) Int. Cl.
*G11C 5/06* (2006.01)
*H10B 41/20* (2023.01)
(Continued)

(52) U.S. Cl.
CPC ............. *G11C 5/063* (2013.01); *H10B 41/20* (2023.02); *H10B 41/27* (2023.02); *H10B 41/50* (2023.02);
(Continued)

(58) Field of Classification Search
CPC ........ G11C 5/063; H10B 51/10; H10B 51/20; H10B 51/40; H10B 41/20; H10B 41/27;
(Continued)

(56) References Cited

U.S. PATENT DOCUMENTS 10,199,326 B1 2/2019 Ohsaki
10,811,431 B1 10/2020 Makala et al.
(Continued)

OTHER PUBLICATIONS

ISR-WO—Notification of Transmittal of The International Search Report and Written Opinion of the International Searching Authority for International Patent Application No. PCT/US2025/026521, mailed Aug. 12, 2025, 10 pages.
(Continued)

*Primary Examiner* — Alexander Sofocleous
*Assistant Examiner* — Joseph Fidelis Stormes
(74) *Attorney, Agent, or Firm* — THE MARBURY LAW GROUP PLLC

(57) ABSTRACT

A device structure includes base semiconductor rail structures overlying a semiconductor substrate, bottom bit lines contacting a sidewall of a respective one of the base semiconductor rail structures, a two-dimensional array of lower semiconductor pillars, lower gate electrode lines overlying the bottom bit lines and laterally spaced from sidewall segments of a respective column of the lower semiconductor pillars by a lower gate dielectric layer, a two-dimensional array of upper semiconductor pillars, upper gate electrode lines overlying the lower gate electrode lines and laterally spaced from sidewall segments of a respective column of the upper semiconductor pillars by an upper gate dielectric layer, and at least one top bit line contacting top surfaces of a respective row of upper semiconductor pillars.

20 Claims, 63 Drawing Sheets

(51) Int. Cl.

| | |
|---|---|
| ***H10B 41/27*** | (2023.01) |
| ***H10B 41/50*** | (2023.01) |
| ***H10B 43/10*** | (2023.01) |
| ***H10B 43/20*** | (2023.01) |
| ***H10B 43/27*** | (2023.01) |
| ***H10B 43/40*** | (2023.01) |
| ***H10B 51/10*** | (2023.01) |
| ***H10B 51/20*** | (2023.01) |
| ***H10B 51/40*** | (2023.01) |
| ***H10B 51/50*** | (2023.01) |
| ***H10D 30/01*** | (2025.01) |
| ***H10D 30/69*** | (2025.01) |
| ***H10W 20/41*** | (2026.01) |
| ***H10W 20/42*** | (2026.01) |

(52) U.S. Cl.
CPC ............ *H10B 43/10* (2023.02); *H10B 43/20* (2023.02); *H10B 43/27* (2023.02); *H10B 43/40* (2023.02); *H10B 51/10* (2023.02); *H10B 51/20* (2023.02); *H10B 51/40* (2023.02); *H10B 51/50* (2023.02); *H10D 30/0415* (2025.01); *H10D 30/701* (2025.01); *H10W 20/42* (2026.01); *H10W 20/435* (2026.01)

(58) Field of Classification Search
CPC ........ H10B 41/50; H10B 43/10; H10B 43/20; H10B 43/27; H10B 43/40; H10B 51/50; H10D 30/0415; H10D 30/701; H10W 20/42; H10W 20/435
See application file for complete search history.

(56) References Cited

U.S. PATENT DOCUMENTS

| | | | | |
|---|---|---|---|---|
| 10,833,101 | B2 | 11/2020 | Shimomura et al. | |
| 10,868,042 | B1 | 12/2020 | Zhang et al. | |
| 10,879,269 | B1 | 12/2020 | Zhang et al. | |
| 10,916,287 | B2 | 2/2021 | Zhang et al. | |
| 10,923,502 | B2 | 2/2021 | Sato | |
| 10,978,482 | B2 | 4/2021 | Alsmeier et al. | |
| 11,114,534 | B2 | 9/2021 | Rajashekhar et al. | |
| 11,239,254 | B2 | 2/2022 | Sharangpani et al. | |
| 11,251,199 | B2 | 2/2022 | Zhang et al. | |
| 11,495,613 | B2 | 11/2022 | Baraskar et al. | |
| 11,538,828 | B2 | 12/2022 | Baraskar et al. | |
| 2007/0029607 | A1 | 2/2007 | Kouznetzov | |
| 2020/0411072 | A1* | 12/2020 | Zhang | H10B 51/20 |
| 2021/0036162 | A1* | 2/2021 | Rigano | H10D 86/421 |
| 2021/0159248 | A1 | 5/2021 | Zhang et al. | |
| 2021/0175251 | A1 | 6/2021 | Zhang et al. | |
| 2021/0202703 | A1 | 7/2021 | Rajashekhar et al. | |
| 2021/0242241 | A1 | 8/2021 | Rajashekhar et al. | |
| 2021/0398994 | A1 | 12/2021 | Young et al. | |
| 2022/0037483 | A1 | 2/2022 | Lowe | |
| 2022/0068929 | A1 | 3/2022 | Karda et al. | |
| 2022/0068966 | A1 | 3/2022 | Rabkin et al. | |
| 2022/0285392 | A1 | 9/2022 | Servalli et al. | |
| 2024/0008281 | A1 | 1/2024 | Sondhi et al. | |
| 2024/0064991 | A1 | 2/2024 | Sondhi et al. | |
| 2024/0064992 | A1 | 2/2024 | Sharangpani | |
| 2024/0064995 | A1 | 2/2024 | Rajashekhar et al. | |

OTHER PUBLICATIONS

Patel, D. et al., "Going Vertical: Gate All around, 3D DRAM, 3D NAND—Kokusai Electric IPO," Kokusai Electric IPO, 2024 to 2026 WFE Share, Memory Pricing, Atomic Layer Deposition (ALD), ASM International, Tokyo Electron, Applied Materials, Lam Research, Deposition Process, https://www.semianalysis.com/p/going-vertical-gate-all-around-3d.

Ramaswamy, N. et al., "NVDRAM: A 32Gb Dual Layer 3D Stacked Non-volatile Ferroelectric Memory with Near-DRAM Performance for Demanding AI Workloads," *2023 International Electron Devices Meeting (IEDM)*, San Francisco, CA, USA, 2023, pp. 1-4, DOI: 10.1109/IEDM45741.2023.10413848.

Yu, S. et al., "Semiconductor Memory Technologies: State-of-the-Art and Future Trends," in Computer, vol. 57, No. 4, pp. 150-154, Apr. 2024, DOI: 10.1109/MC.2024.3363269.

U.S. Appl. No. 18/794,809, filed Aug. 5, 2024, SanDisk Technologies LLC.

U.S. Appl. No. 18/819,475, filed Aug. 29, 2024, SanDisk Technologies LLC.

U.S. Appl. No. 18/819,569, filed Aug. 29, 2024, SanDisk Technologies LLC.

* cited by examiner

NON-VOLATILE MEMORY ARRAY WITH INTEGRATED MEMORY AND ACCESS TRANSISTORS AND METHOD OF MAKING THE SAME

FIELD

The present disclosure relates generally to the field of semiconductor devices, and particularly to a non-volatile memory array with integrated memory and access transistors and methods of manufacturing the same.

BACKGROUND

NAND memory devices provide high memory cell density at a low per-bit cost. As the number of layers in NAND memory devices increases, the length of vertical channels increases and the memory latency of the NAND memory devices increases.

SUMMARY

According to an aspect of the present disclosure, a device structure comprises base semiconductor rail structures overlying a semiconductor substrate; bottom bit lines contacting a sidewall of a respective one of the base semiconductor rail structures; a two-dimensional array of lower semiconductor pillars, wherein each row of the lower semiconductor pillars overlies and is adjoined to a respective one of the base semiconductor rail structures; lower gate electrode lines overlying the bottom bit lines and laterally spaced from sidewall segments of a respective column of the lower semiconductor pillars by a lower gate dielectric layer; a two-dimensional array of upper semiconductor pillars, wherein each of the upper semiconductor pillars contacts a top surface of a respective one of the lower semiconductor pillars; upper gate electrode lines overlying the lower gate electrode lines and laterally spaced from sidewall segments of a respective column of the upper semiconductor pillars by an upper gate dielectric layer; and at least one top bit line contacting top surfaces of a respective row of upper semiconductor pillars.

According to another aspect of the present disclosure, a device structure comprises a semiconductor substrate comprising a frontside surface and a backside surface; a lower field effect transistor located over the frontside surface of the semiconductor substrate, and comprising a lower vertical semiconductor channel, at least one lower gate electrode and a lower gate dielectric layer located between a sidewall of the lower vertical semiconductor channel and a sidewall of the at least one lower gate electrode; and an upper field effect transistor located over the lower field effect transistor, and comprising an upper vertical semiconductor channel, at least one upper gate electrode and an upper gate dielectric layer located between a sidewall of the upper vertical semiconductor channel and a sidewall of the at least one upper gate electrode. The lower vertical semiconductor channel is electrically connected to the upper vertical semiconductor channel; one of the lower gate dielectric layer and the upper gate dielectric layer comprises a non-volatile memory material; and another one of the lower gate dielectric layer and the upper gate dielectric layer is free of any memory material.

According to yet another aspect of the present disclosure, a method of forming a device structure comprises: forming a combination of bottom bit lines, base semiconductor rail structures, and a two-dimensional array of lower semiconductor pillars on a semiconductor substrate, wherein each row of the lower semiconductor pillars overlies, and is adjoined to, a respective one of the base semiconductor rail structures, and wherein each of the bottom bit lines contacts a respective one of the base semiconductor rail structures; forming a lower gate dielectric layer on sidewall segments of the lower semiconductor pillars; forming lower gate electrode lines, wherein each of the lower gate electrode lines is laterally spaced from a respective column of the lower semiconductor pillars by a lower gate dielectric layer; forming a two-dimensional array of upper semiconductor pillars, wherein each of the upper semiconductor pillars is formed directly on a top surface of a respective one of the lower semiconductor pillars; forming an upper gate dielectric layer on sidewall segments of the upper semiconductor pillars; forming upper gate electrode lines, wherein each of the upper gate electrode lines is laterally spaced from a respective column of the upper semiconductor pillars by an upper gate dielectric layer; and forming at least one top bit line on top surfaces of a respective row of upper semiconductor pillars.

DETAILED DESCRIPTION

Figure 1:
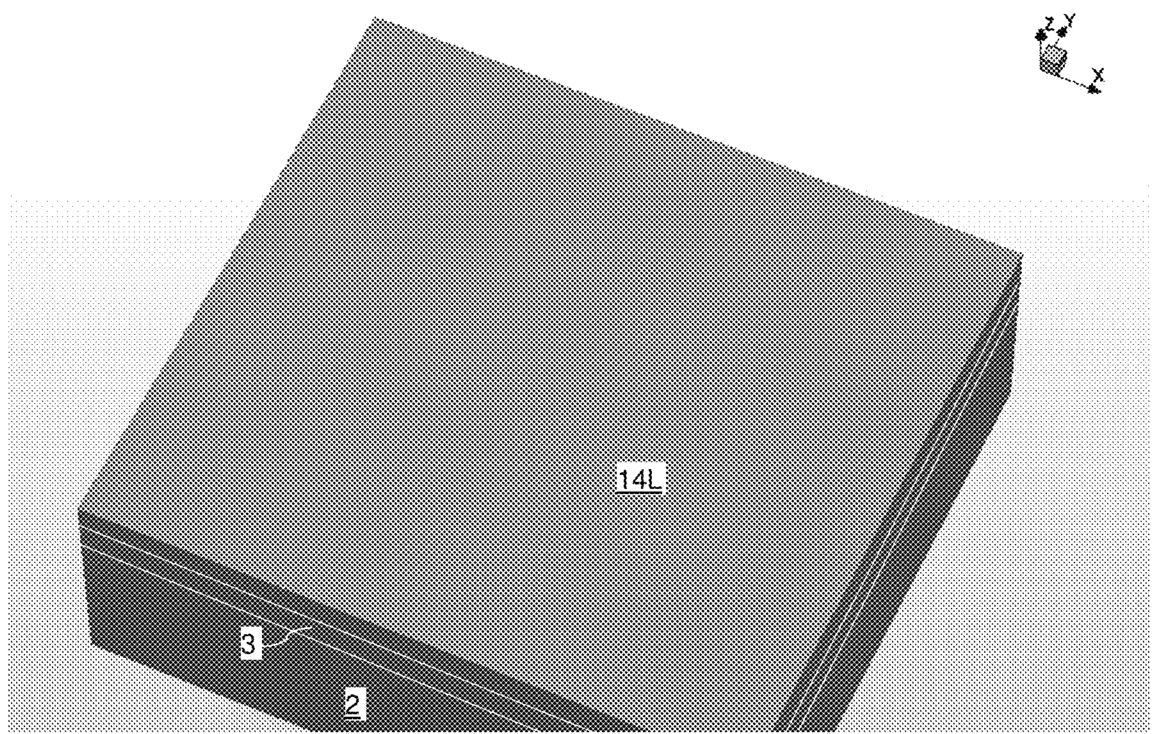
FIG. 1 is a perspective view of an exemplary structure after formation of a semiconductor material layer and a semiconductor pillar material layer according to an embodiment of the present disclosure.

In the field of nonvolatile memory technology, the development of three-dimensional (3D) integration schemes presents challenges, particularly in the integration of memory transistors, such as ferroelectric field effect transistors (FeFETs) with peripheral CMOS driver circuitry. Traditional two-dimensional (2D) FeFET architectures face limitations in scaling and efficiency, which affect the capacity to meet the increasing demands for higher density in memory arrays. Additionally, traditional architectures often encounter difficulties in routing interconnects and efficiently utilizing wafer space, leading to higher manufacturing costs and performance degradation of peripheral circuits.

As discussed above, the embodiments of the present disclosure are directed to a non-volatile memory array with integrated memory and access transistors and methods of manufacturing the same, the various aspects of which are described below. The embodiments of the disclosure may be employed to form various non-volatile memory structures. Each unit cell may comprise a vertically stacked combination of an access transistor and a memory transistor including a memory element (e.g., ferroelectric layer) therein. The vertically stacked memory and access transistors improve memory array density while maintaining or enhancing the reliability and speed of memory arrays.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exists a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated. The exemplary structure comprises a semiconductor substrate 2, such as a commercially available single crystalline silicon wafer. The semiconductor substrate 2 may comprise a single crystalline semiconductor material, such as single crystalline silicon. A semiconductor material layer 3 having a doping of a first conductivity type (which may be p-type or n-type) may be formed on or in an upper portion of the semiconductor substrate 2 by conversion of an upper portion of the semiconductor substrate 2 into the semiconductor material layer 3 (e.g., by ion implanting a doped well into the upper portion of the semiconductor substrate 2), and/or by deposition of a doped semiconductor layer (e.g., p-type doped single crystalline silicon) over the top surface of the semiconductor substrate 2. For example, the semiconductor material layer 3 may comprise a p-type doped well (e.g., boron doped silicon well) in the upper portion of the semiconductor substrate (e.g., silicon wafer) 2.

A semiconductor pillar material layer 14L having a doping of a second conductivity type that is the opposite of the first conductivity type can be formed over the semiconductor material layer 3. For example, if the first conductivity type is p-type, the second conductivity type is n-type, and vice versa. The semiconductor pillar material layer 14L can be formed by conversion of an upper portion of the semiconductor material layer 3 into the semiconductor pillar material layer 14B by introducing electrical dopants of the second conductivity type therein, or by deposition of a doped semiconductor layer over the top surface of the semiconductor material layer 3. Alternatively, the semiconductor substrate 2 may have a doping of the second conductivity type, and a buried portion of the semiconductor substrate 2 may be converted into the semiconductor material layer 3 having a doping of the first conductivity type by implanting electrical dopants of the first conductivity with high energy. In this case, an undoped surface portion of the semiconductor substrate 2 becomes the semiconductor pillar material layer 14L.

The thickness of the semiconductor pillar material layer 14L may be in a range from 40 nm to 1,000 nm, such as from 100 nm to 500 nm, although lesser and greater thicknesses may also be employed. The thickness of the semiconductor material layer 3 may be in a range from 50 nm to 3,000 nm, such as from 100 nm to 1,000 nm, although lesser and greater thicknesses may also be employed. Alternatively, the semiconductor material layer 3 may have the same material composition as the semiconductor substrate 2, and thus, be an upper portion of the semiconductor substrate 2 having the doping of the first conductivity type. Generally, at least one ion implantation processes and/or at least one epitaxial semiconductor layer deposition process may be employed to provide a combination of a semiconductor material layer 3 having a doping of a first conductivity type and a semiconductor pillar material layer 14L having a doping of a second conductivity type. Thus, a p-n junction can be formed between the semiconductor material layer 3 and the semiconductor pillar material layer 14L, which can be advantageously employed to provide electrical isolations between neighboring pairs of first semiconductor pillars to be subsequently patterned out of the semiconductor pillar material layer 14L.

In one embodiment, the im-process memory array includes a semiconductor material layer 3 including a first single crystalline semiconductor material, the semiconductor pillar material layer 14L comprises a second single crystalline semiconductor material that is epitaxially aligned to the first single crystalline semiconductor material. In one embodiment, the semiconductor material layer 3 has a doping of a first conductivity type, and the semiconductor pillar material layer 14L has a doping of a second conductivity type that is an opposite of the first conductivity type.

Figure 2A:
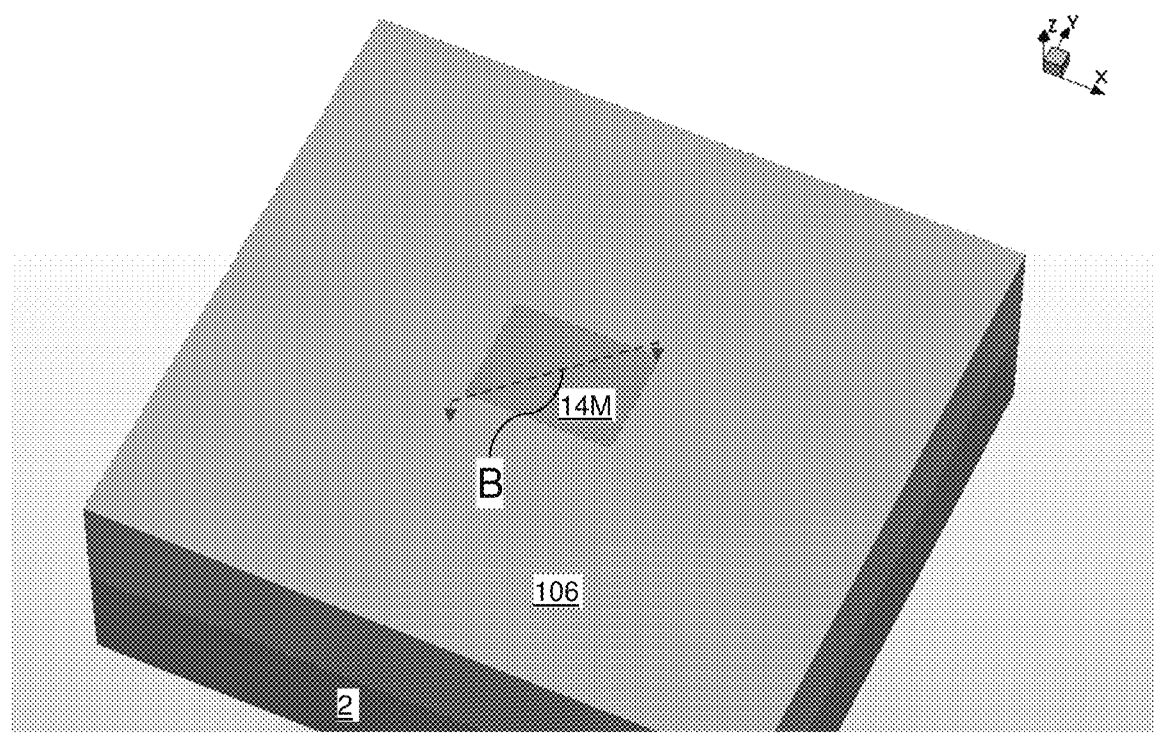
FIG. 2A is a perspective view of the exemplary structure after formation of a dielectric material portion around the semiconductor material layer according to an embodiment of the present disclosure.
Figure 2B:
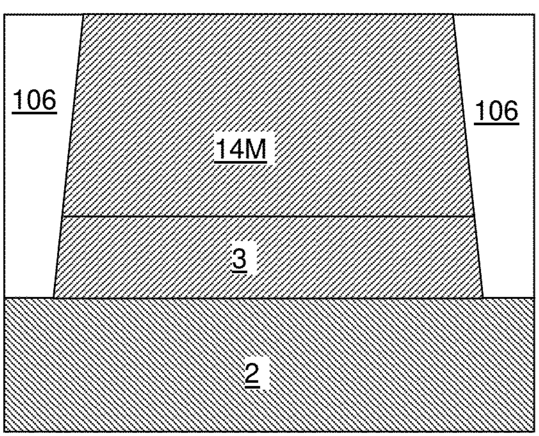
FIG. 2B is a vertical cross-sectional view of a region of the first exemplary structure along the vertical cut plane B of FIG. 2A.

Referring to FIGS. 2A and 2B, at least one hardmask layer (not illustrated) may be optionally formed over the semiconductor pillar material layer 14L. A photoresist layer (not shown) can be applied over the semiconductor pillar material layer 14L and over the at least one hardmask layer (if present), and can be lithographically patterned to cover at least one memory array region in which a memory array is to be subsequently formed. An etch process can be performed to pattern the semiconductor pillar material layer 14L in the memory array region into at least one active region mesa 14M. The etch process may comprise an anisotropic etch process (such as a reactive ion etch process) or an isotropic etch process (such as a wet etch process). The duration of the etch process can be selected such that the entire thickness of the semiconductor pillar material layer 14L is etched through. Optionally, the etch may extend partially or entirely through or around the semiconductor material layer 3 to expose an upper portion of the semiconductor substrate 2.

A planarizable dielectric material, such as a silicate glass (i.e., silicon oxide) may be deposited in the trench around the active region mesa 14M. A planarization process may be performed to remove portions of the planarizable dielectric material from above the horizontal plane including the top surface of the active region mesa 14M. The planarization process may comprise a chemical mechanical polishing process and/or a recess etch process. The at least one hardmask layer can be subsequently removed selectively to the material of the active region mesa 14M and the planarizable dielectric material by performing a selective etch process. The remaining portion of the planarizable dielectric material comprises a dielectric material portion 106. Generally, the dielectric material portion 106 is formed on sidewalls of the active region mesa 14M.

Figure 3A:
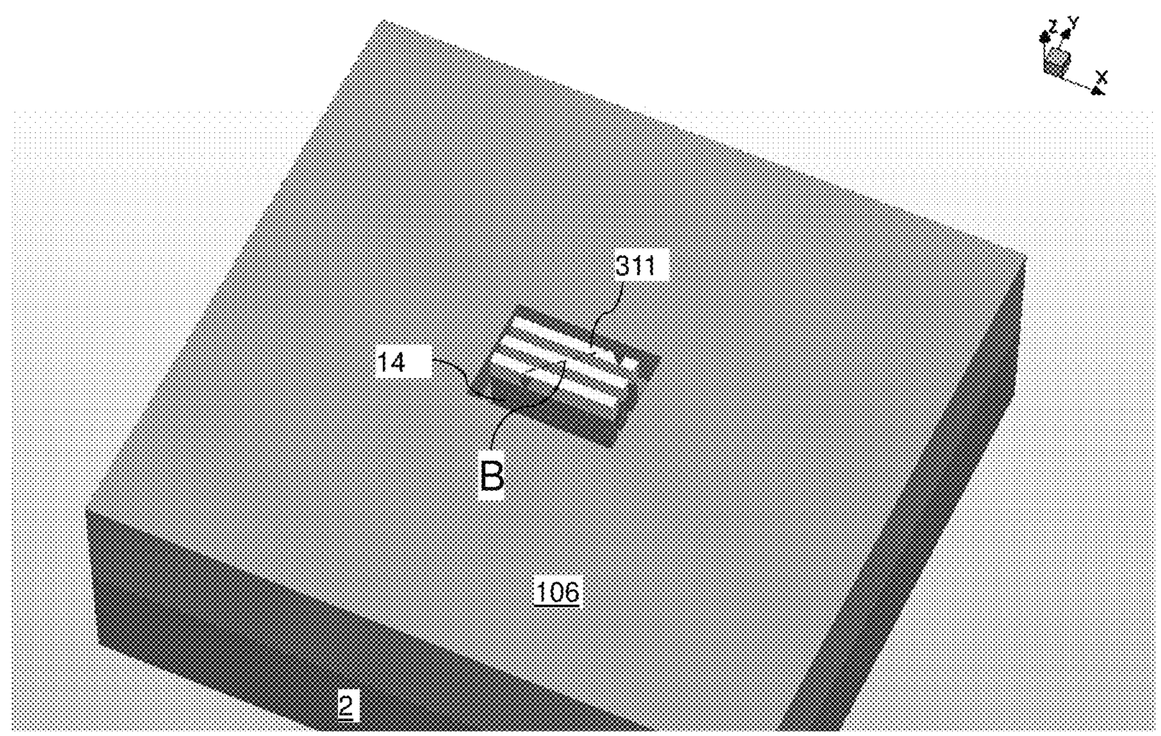
FIG. 3A is a perspective view of the exemplary structure after formation of semiconductor rail structures according to an embodiment of the present disclosure.
Figure 3B:
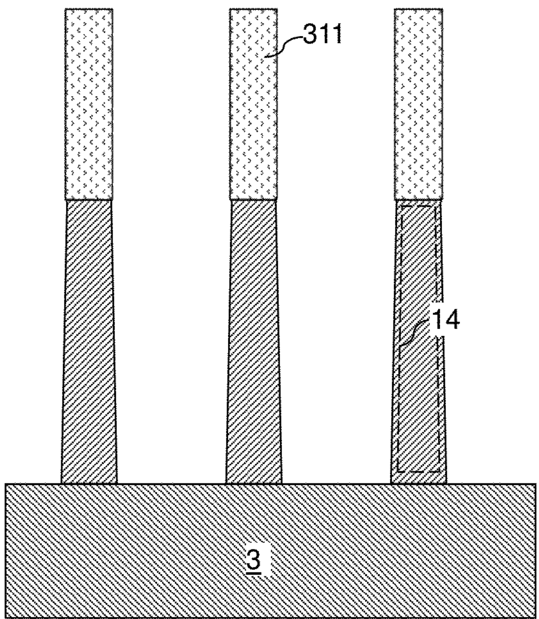
FIG. 3B is a vertical cross-sectional view of a region of the first exemplary structure along the vertical cut plane B of FIG. 3A.

Referring to FIGS. 3A and 3B, a photoresist layer can be applied over the active region mesa 14M and can be lithographically patterned to form first line-shaped photoresist material portions 311 arranged in a periodic line pattern. Each first line-shaped photoresist material portion 311 may laterally extend along a first horizontal direction (such as an x-direction) and can be laterally spaced apart along a second horizontal direction (such as a y-direction). The first line-shaped photoresist material portion 311 may be periodic along the second horizontal direction. The width of each first line-shaped photoresist material portion 311 may be in a range from 10 nm to 200 nm, although lesser and greater widths may also be employed. The spacing between each neighboring pair of first line-shaped photoresist material portions 311 may be in a range from 50 nm to 500 nm, although lesser and greater spacings may also be employed. While FIGS. 3A and 3B schematically illustrate only three of the first line-shaped photoresist material portions 311, it should be understood that the total number of first line-shaped photoresist material portions 311 may be in a range from 2 to $2^{20}$, and may be selected based on the performance requirement of the memory array to be subsequently formed.

An anisotropic etch process can be performed to transfer the pattern of the first line-shaped photoresist material portion 311 into the active region mesa 14M. Unmasked portions of the active region mesa 14M can be anisotropically etched selectively to the material of the dielectric material portion 106. Alternatively, the photoresist layer may be patterned such that a remaining portion of the photoresist layer covers the dielectric material portion 106 and prevents etching of the dielectric material portion 106. Patterned portions of the active region mesa 14M comprise semiconductor rail structures 14 that laterally extend along a first horizontal direction (such as the x-direction). The semiconductor rail structures 14 may have a respective width in a range from 10 nm to 200 nm, although lesser and greater widths may also be employed. The height of each semiconductor rail structure 14 may be in a range from 40 nm to 1,000 nm, such as from 100 nm to 300 nm, although lesser and greater thicknesses may also be employed. A top surface of the semiconductor material layer 3 can be physically exposed between neighboring pairs of semiconductor rail structures 14. Each laterally neighboring pair of semiconductor rail structures 14 can be electrically isolated from each other by dual p-n junction isolation with the underlying semiconductor material layer 3, which may comprise a p-n-p junction or an n-p-n junction. The first line-shaped photoresist material portion 311 can be subsequently removed, for example, by ashing.

Figure 4A:
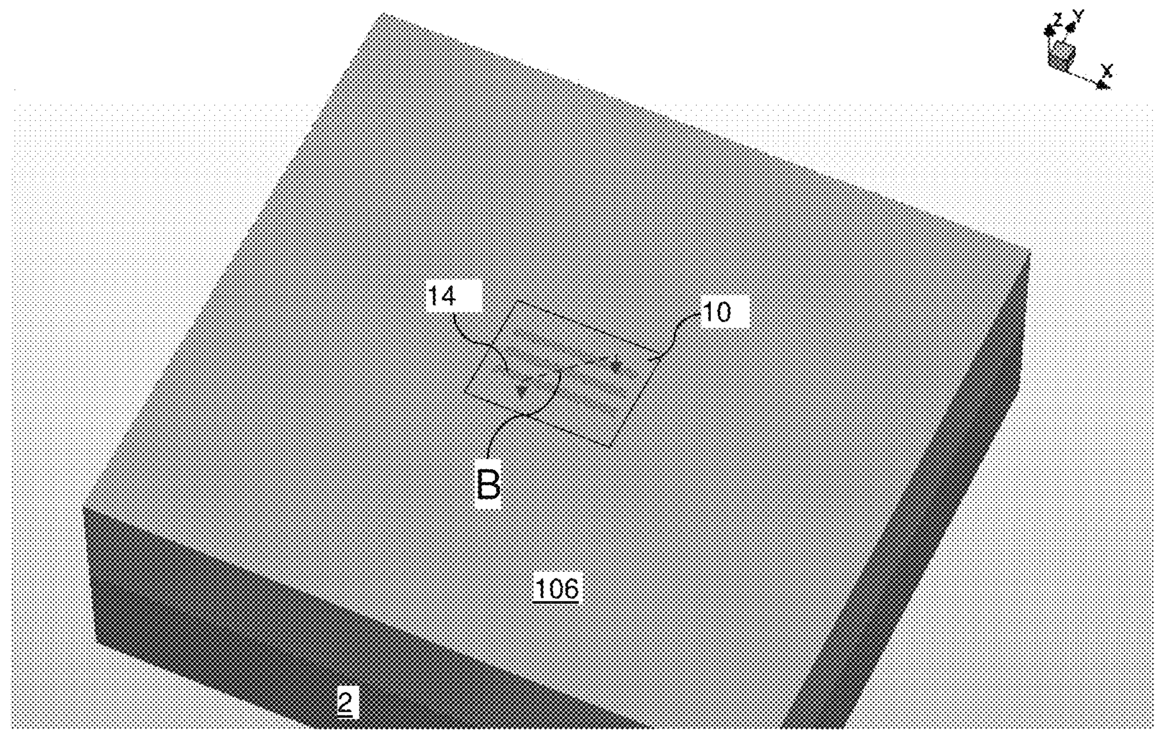
FIG. 4A is a perspective view of the exemplary structure after formation of a base dielectric layer according to an embodiment of the present disclosure.
Figure 4B:
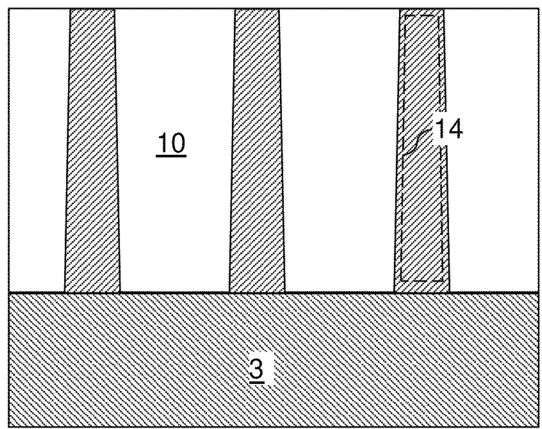
FIG. 4B is a vertical cross-sectional view of a region of the first exemplary structure along the vertical cut plane B of FIG. 4A.

Referring to FIGS. 4A and 4B, a dielectric fill material can be deposited in the cavities laterally surrounding the semiconductor rail structures 14. The dielectric fill material may comprise a planarizable dielectric material, such as a doped silicate glass. Excess portions of the dielectric fill material overlying the horizontal plane including the top surfaces of the semiconductor rail structures 14 can be removed by a planarization process, such as a chemical mechanical polishing process and/or a recess etch process. The remaining portions of the dielectric fill material that laterally surrounds the semiconductor rail structures 14 comprise a base dielectric layer 10.

Figure 5A:
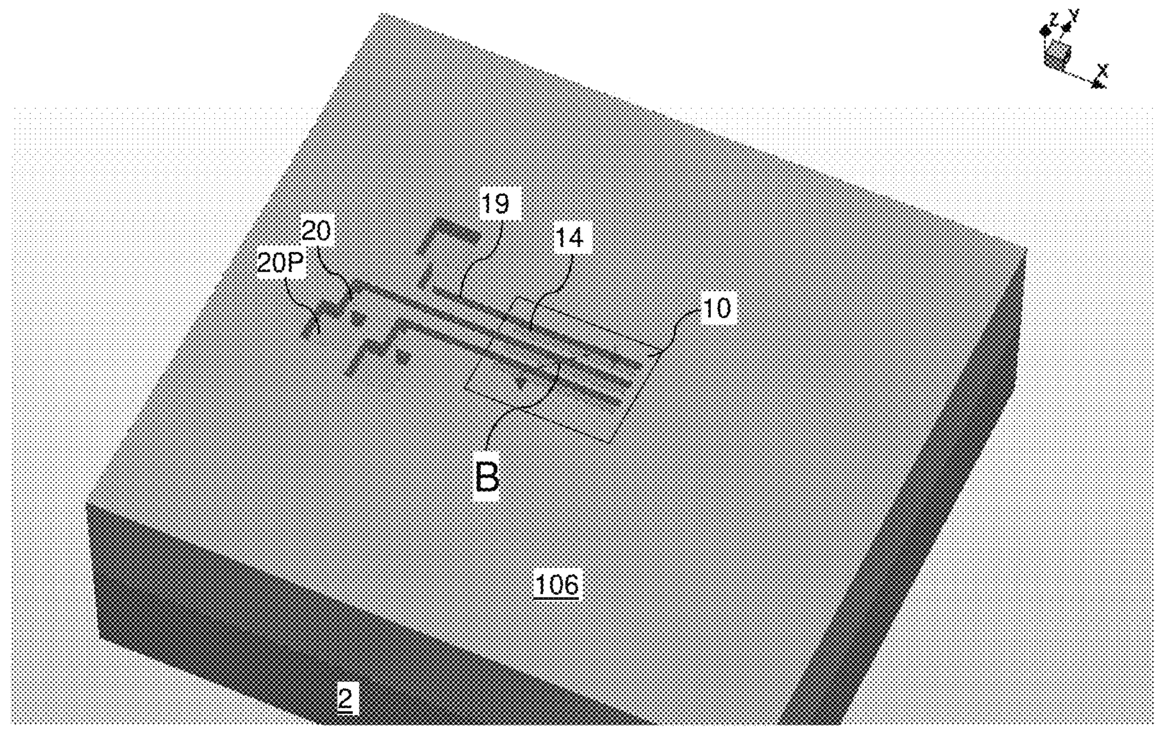
FIG. 5A is a perspective view of the exemplary structure after formation of bottom bit lines and bottom bit line contact pads according to an embodiment of the present disclosure.
Figure 5B:
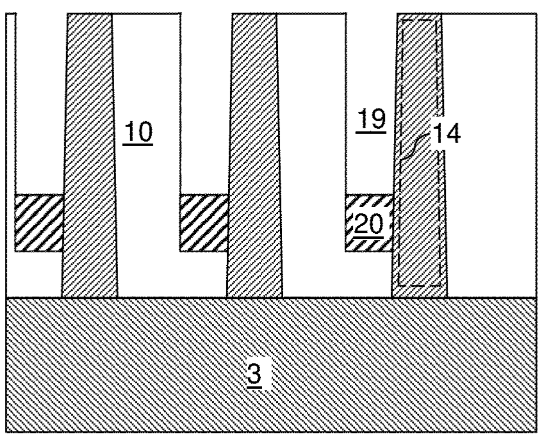
FIG. 5B is a vertical cross-sectional view of a region of the first exemplary structure along the vertical cut plane B of FIG. 5A.

Referring to FIGS. 5A and 5B, a photoresist layer (not shown) can be applied over the base dielectric layer 10 and the dielectric material portion 106, and can be lithographically patterned to form a pattern of openings. The pattern of openings include elongated line-shaped openings having a respective end portion that is connected to a respective pad-shaped opening. The elongated line-shaped openings can be formed such that each of the elongated line-shaped openings has an edge that overlaps with a sidewall of a respective semiconductor rail structure 14. An anisotropic etch process can be performed to transfer the pattern of the openings in the photoresist layer into the base dielectric layer 10 and the dielectric material portion 106. Base-level trenches 19 are formed in an upper portion of the base dielectric layer 10 and the dielectric material portion 106 within volumes from which materials of the base dielectric layer 10 and the dielectric material portion 106 are removed. The depth of the base-level trenches 19 can be in a range from 50% to 95%, such as from 70% to 90%, of the height of the semiconductor rail structures 14. The photoresist layer can be subsequently removed, for example, by ashing.

At least one electrically conductive material can be deposited in the base-level trenches 19. The at least one electrically conductive material may comprise a combination of a metallic barrier material (such as TiN, TaN, WN, and/or MoN) and a metal fill material (such as W, Co, Ru, Mo, Ti, Ta, etc.). The at least one electrically conductive material can fill the entire volume of the base-level trenches 19. A horizontally-extending portion of the at least one electrically conductive material overlies the top surfaces of the base dielectric layer 10 and the dielectric material portion 106. A recess etch process or a chemical mechanical polishing process can be performed to remove the horizontally-extending portion of the at least one electrically conductive material from above the horizontal plane including the top surfaces of the base dielectric layer 10 and the dielectric material portion 106. Subsequently, a selective recess etch process can be performed to vertically recess portions of the at least one electrically conductive material located in the base-level trenches 19 selectively to the dielectric materials of the base dielectric layer 10 and the dielectric material portion 106. In an illustrative example, if the at least one electrically conductive material comprises tungsten, a wet etch process employing a mixture of ammonium hydroxide and hydrogen peroxide may be employed to recess tungsten.

Each contiguous remaining portion of the at least one electrically conductive material fills a bottom portion of a respective one of the base-level trenches 19, and constitutes a combination of a bottom bit line 20 and a bottom bit line contact pad 20P. The duration of the selective recess etch process can be selected such that the bottom bit lines 20 have a vertical extent (i.e., height) that is in a range from 5% to 50%, such as 10% to 20%, of the height of the semiconductor rail structures 14. Each bottom bit lines 20 contacts a sidewall of a respective one of the semiconductor rail structures 14 and laterally extends into the dielectric material portion 106, and is adjoined to a respective one of the bottom bit line contact pads 20P. The lateral dimensions of the bottom bit line contact pads 20P can be greater than lateral dimensions of connection via structures to be subsequently formed through a lower portion of the dielectric material portion 106. For example, the bottom bit line contact pads 20P may have lateral dimensions in a range from 300 nm to 3 microns. Each bottom bit line 20 can be embedded within the base dielectric layer 10, and can be vertically spaced from the semiconductor substrate 2 and the semiconductor material layer 3 by a horizontally-extending portion of the base dielectric layer 10.

Figure 6A:
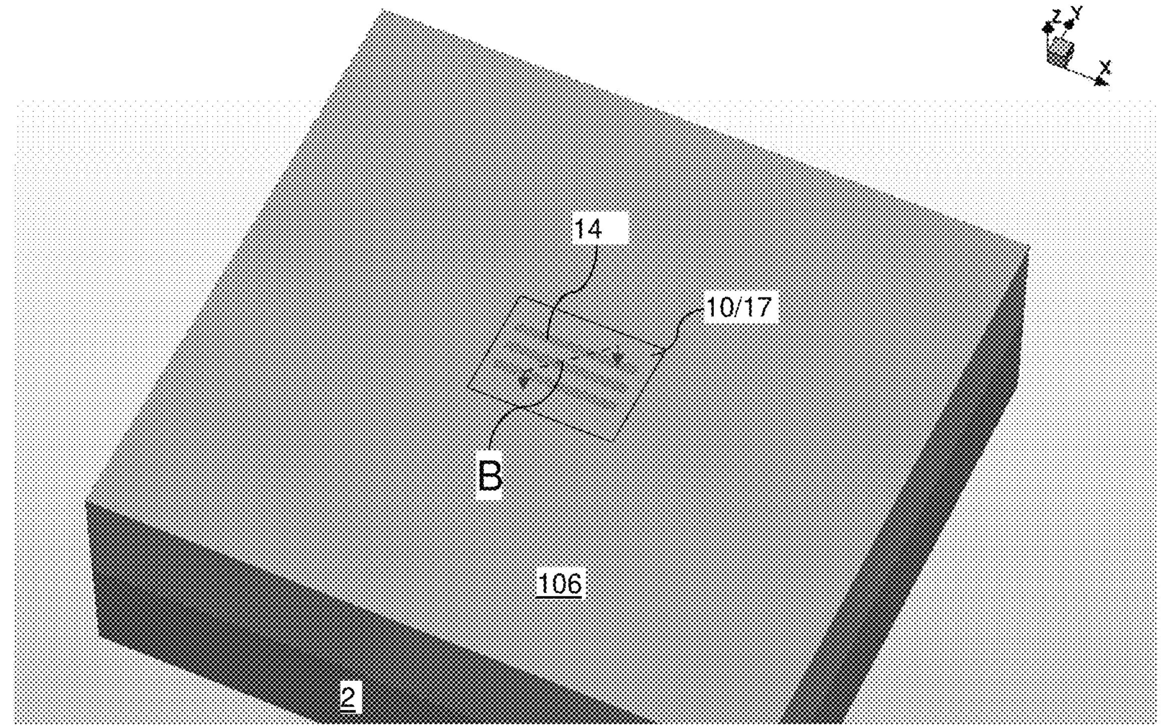
FIG. 6A is a perspective view of the exemplary structure after formation of a cover dielectric material portions according to an embodiment of the present disclosure.
Figure 6B:
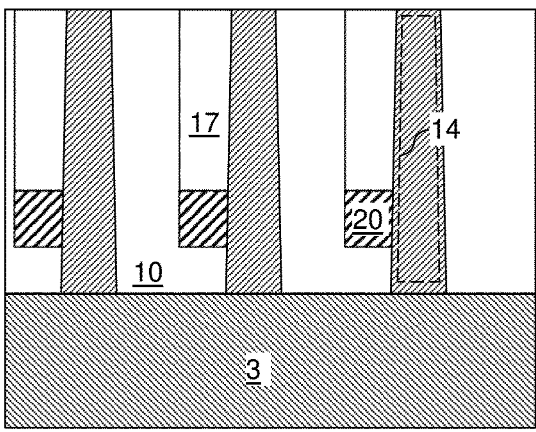
FIG. 6B is a vertical cross-sectional view of a region of the first exemplary structure along the vertical cut plane B of FIG. 6A.

Referring to FIGS. 6A and 6B, a dielectric fill material, such as a silicate glass material, can be deposited in unfilled volumes of the base-level trenches 19. Excess portions of the dielectric fill material can be removed from above the horizontal plane including the top surfaces of the semiconductor rail structures 14 by performing a planarization process, which may comprise a chemical mechanical polishing process or a recess etch process. Each remaining portion of the dielectric fill material filling an upper portion of a respective base-level trench 19 constitutes a cover dielectric material portion 17. Top surfaces of the cover dielectric material portions 17, the base dielectric layer 10, the dielectric material portion 106, and the semiconductor rail structures 14 may be located within a same horizontal plane.

Figure 7A:
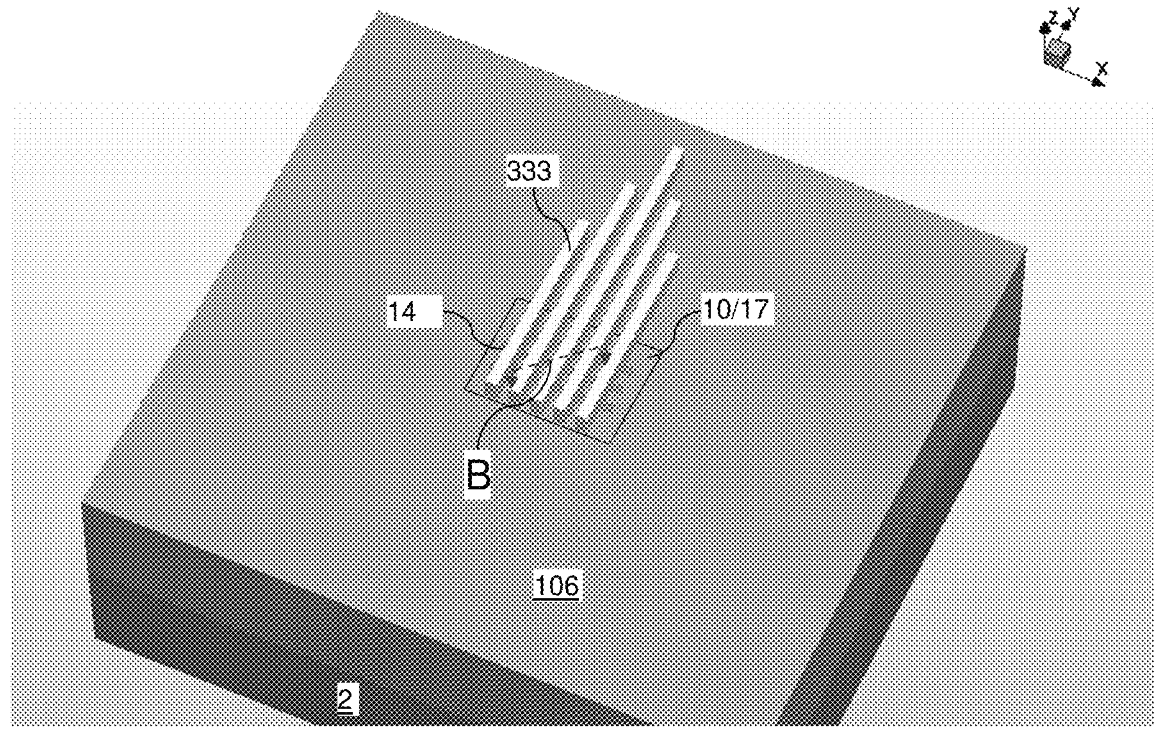
FIG. 7A is a perspective view of the exemplary structure after formation of second line-shaped photoresist material portions according to an embodiment of the present disclosure.
Figure 7B:
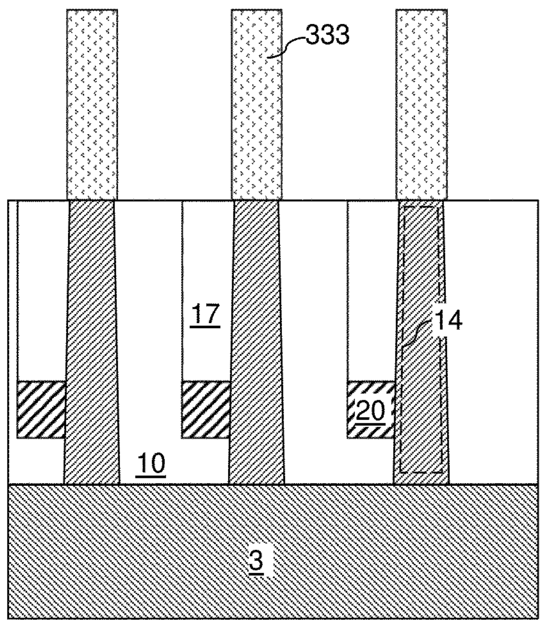
FIG. 7B is a vertical cross-sectional view of a region of the first exemplary structure along the vertical cut plane B of FIG. 7A.

Referring to FIGS. 7A and 7B, a photoresist layer can be applied over the top surfaces of the cover dielectric material portions 17, the base dielectric layer 10, the dielectric material portion 106, and the semiconductor rail structures 14, and can be lithographically patterned to form second line-shaped photoresist material portions 333 arranged in a periodic line pattern. Each second line-shaped photoresist material portion 333 may laterally extend along the second horizontal direction (such as the y-direction) and can be laterally spaced apart along the first horizontal direction (such as the x-direction). The second line-shaped photoresist material portion 333 may be periodic along the first horizontal direction. The width of each second line-shaped photoresist material portion 333 may be in a range from 10 nm to 200 nm, although lesser and greater widths may also be employed. The spacing between each neighboring pair of second line-shaped photoresist material portions 333 may be in a range from 50 nm to 500 nm, although lesser and greater spacings may also be employed. While FIG. 7A schematically illustrates only five of the second line-shaped photoresist material portions 333, it should be understood that the total number of second line-shaped photoresist material portions 333 may be in a range from 2 to $2^{20}$, and may be selected based on the performance requirement of the memory array to be subsequently formed.

Figure 8A:
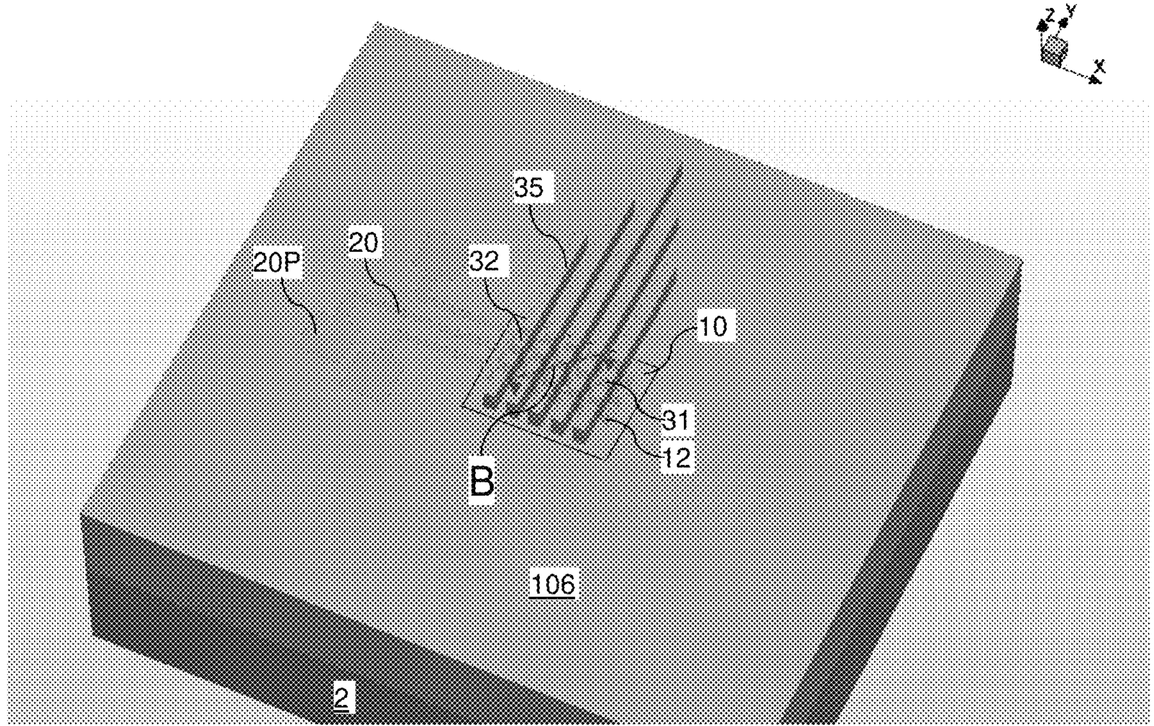
FIG. 8A is a perspective view of the exemplary structure after formation of a two-dimensional array of lower semiconductor pillars and a two-dimensional array of lower dielectric pillars according to an embodiment of the present disclosure.
Figure 8B:
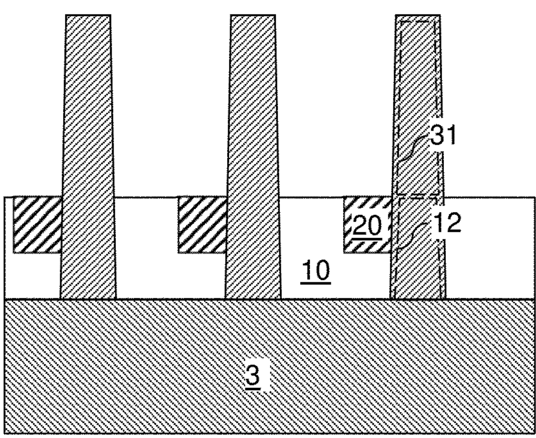
FIG. 8B is a vertical cross-sectional view of a region of the first exemplary structure along the vertical cut plane B of FIG. 8A.

Referring to FIGS. 8A and 8B, an anisotropic etch process can be performed to transfer the pattern of the second line-shaped photoresist material portion 333 through upper portions of the semiconductor rail structures 14, the cover dielectric material portions 17, the base dielectric layer 10, and the dielectric material portion 106 that overlie the horizontal plane including the top surfaces of the bottom bit lines 20. Unmasked portions of the semiconductor rail structures 14, the cover dielectric material portions 17, the base dielectric layer 10, and the dielectric material portion 106 that overlie the horizontal plane including the top surfaces of the bottom bit lines 20 can be anisotropically etched by the anisotropic etch process.

Each semiconductor rail structure 14 is patterned into an assembly of a base semiconductor rail structure 12 that underlies the horizontal plane including the top surfaces of the bottom bit lines 20, and a row of lower semiconductor pillars 31 arranged along the first horizontal direction (such as the x-direction). Unmasked portions of the base dielectric layer 10 and the dielectric material portion 106 can be vertically recessed such that top surfaces of the unmasked portions of the base dielectric layer 10 and the dielectric material portion 106 are formed at or near the horizontal plane including the top surfaces of the bottom bit lines 20.

Masked portions of the cover dielectric material portions 17 and the base dielectric layer 10 that underlie the second line-shaped photoresist material portion 333 and are located in the memory array region form a two-dimensional array of first dielectric pillars 32. A two-dimensional array of first dielectric pillars 32 is interlaced with the two-dimensional array of lower semiconductor pillars 31. Masked portions of the dielectric material portion 106 that underlie the second line-shaped photoresist material portion 333 form first dielectric material rails 35. Top surfaces of the bottom bit lines 20 and the bottom bit line contact pads 20P can be physically exposed. The vertical extent (i.e., the height) of the lower semiconductor rails 12 may be in a range from 50% to 80% of the thickness of the semiconductor pillar material layer 14L. For example, the vertical extent of the lower semiconductor rails 11 may be in a range from 20 nm to 800 nm, such as from 100 nm to 500 nm, although lesser and greater vertical extents may also be employed. The second line-shaped photoresist material portion 333 can be subsequently removed, for example, by ashing.

In summary, a combination of bottom bit lines 20, base semiconductor rail structures 12, and a two-dimensional array of lower semiconductor pillars 31 can be formed. The base semiconductor rail structures 12 overlie a semiconductor substrate 2. Each of the bottom bit lines 20 contacts a sidewall of a respective one of the base semiconductor rail structures 12. Each row of the lower semiconductor pillars 31 overlies and is adjoined to a respective one of the base semiconductor rail structures 12. In one embodiment, the semiconductor material layer 3 includes a first single crystalline semiconductor material, and each of the lower semiconductor pillars 31 comprises a respective portion of a second single crystalline semiconductor material that is epitaxially aligned to the first single crystalline semiconductor material. In one embodiment, the semiconductor material layer 3 has a doping of a first conductivity type, and the lower semiconductor pillars 31 have a doping of a second conductivity type that is an opposite of the first conductivity type. A base dielectric layer 10 laterally surrounds the base semiconductor rail structures 12, embeds the bottom bit lines 20, and overlies the semiconductor substrate 2 and the semiconductor material layer 3. The bottom bit lines 20 are vertically spaced from the semiconductor material layer 3 by a horizontally-extending portion of the base dielectric layer 10.

Figure 9A:
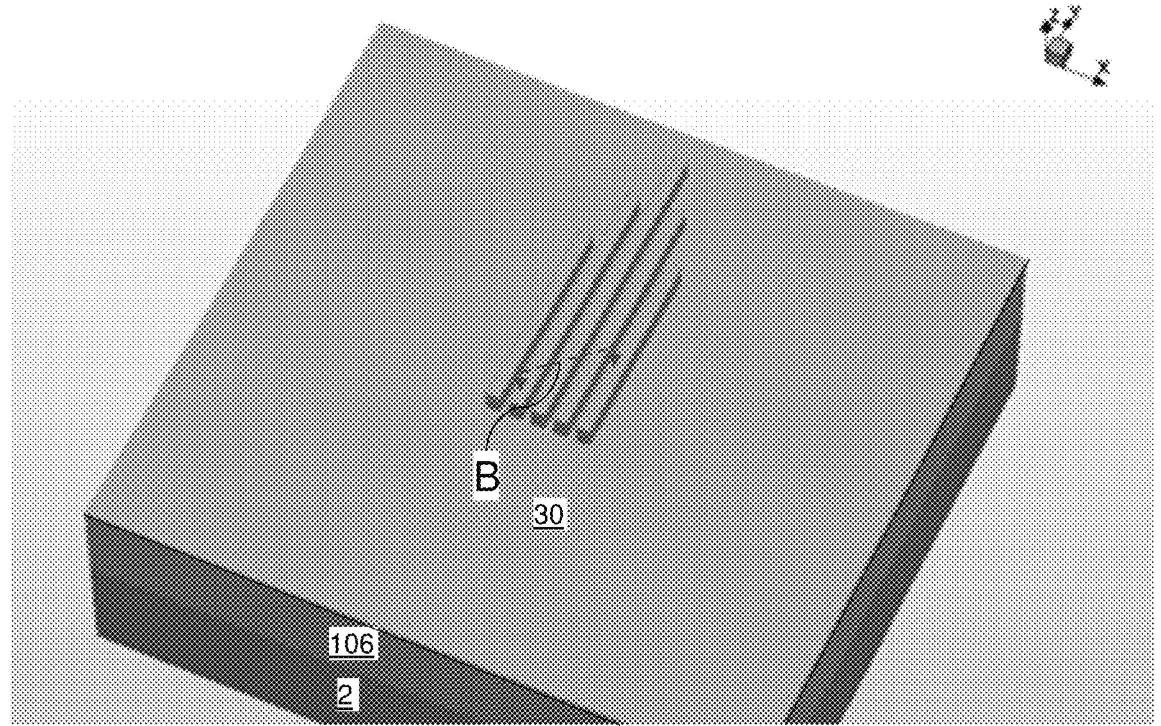
FIG. 9A is a perspective view of the exemplary structure after formation of a lower gate dielectric layer according to an embodiment of the present disclosure.
Figure 9B:
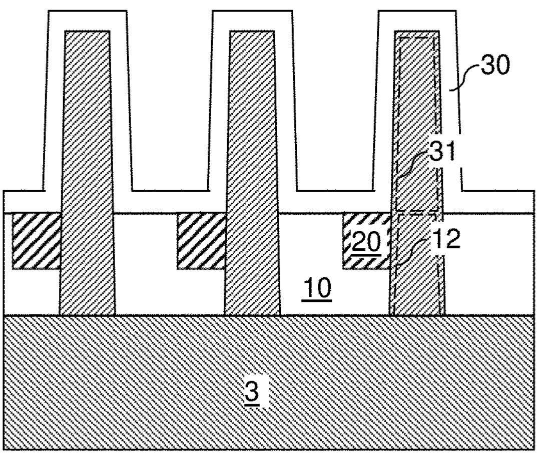
FIG. 9B is a vertical cross-sectional view of a region of the first exemplary structure along the vertical cut plane B of FIG. 9A.

Referring to FIGS. 9A and 9B, a lower gate dielectric layer 30 can be formed by conformally depositing a first gate dielectric material over the physically exposed surfaces of the two-dimensional array of lower semiconductor pillars 31 and the two-dimensional array of first dielectric pillars 32 and on the physically exposed horizontal surfaces of the base dielectric layer 10 and the dielectric material portion 106. Generally, the lower gate dielectric layer 30 comprises a horizontally-extending portion and vertically-extending portions that are adjoined to, and protrude upward from the horizontally-extending portion. The first gate dielectric material may comprise a non-volatile memory material (e.g., ferroelectric material), or may comprise a non-memory dielectric material (e.g., a non-ferroelectric material, such as silicon oxide). The thickness of the lower gate dielectric layer 30 may be selected based on the operating voltage of a two-dimensional array of lower transistors to be subsequently formed, and may be in a range from 1 nm to 30 nm, such as from 2 nm to 10 nm, although lesser and greater thicknesses may also be employed. Vertically extending portions of the lower gate dielectric layer 30 that laterally extend along the second horizontal direction laterally contacts a respective column of first dielectric pillars 32 within the two-dimensional array of first dielectric pillars 32.

As used herein, a "memory material" refers to any material or a set of materials that can store data therein. A non-volatile memory material may store information in the form of at least two non-volatile memory states that provide different transconductance for the semiconductor material within the lower semiconductor pillars 31. For example, a memory material may store information in the form of a change in the direction of ferroelectric polarization, a change in the amount of trapped electrical charges (e.g., electrons) therein, or a change in electrical resistivity of the material.

In one embodiment, the first gate dielectric material of the lower gate dielectric layer 30 may be free of any memory material, and thus, does not provide any hysteresis effect and does not store data therein. In one embodiment, the first gate dielectric material of the lower gate dielectric layer 30 may comprise any of gate dielectric materials that do not provide any hysteresis effect as known in the art. For example, the first gate dielectric material of the lower gate dielectric layer 30 may comprise silicon oxide, silicon oxynitride, and/or at least one dielectric metal oxide (such as aluminum oxide and/or at least one transition metal oxide). If the first gate dielectric material of the lower gate dielectric layer 30 is free of any memory material, a second gate dielectric material for an upper gate dielectric layer to be subsequently formed includes a non-volatile memory material.

In another embodiment, the first gate dielectric material of the lower gate dielectric layer 30 includes a non-volatile memory material, and thus, provides at least two different states that affect the conductivity of the lower semiconductor pillars 31 along the vertical direction. In this case, each portion of the lower gate dielectric layer 30 in contact with a respective one of the lower semiconductor pillars 31 can store data in a non-volatile manner. The first gate dielectric material of the lower gate dielectric layer 30 may comprise a ferroelectric material that may be programmed to provide a dipole moment that points toward or away from the most proximal one of the lower semiconductor pillars 31. Non-limiting examples of ferroelectric materials include a titanate ferroelectric dielectric material such as barium titanate, lead titanate, lead zirconate titanate, lead lanthanum zirconate titanate (PLZT), potassium niobate ($KNbO_3$), sodium potassium niobate (KNN), lithium niobate ($LiNbO_3$), lithium tantalate ($LiTaO_3$), and bismuth ferrite ($BiFeO_3$). Other ferroelectric materials include strontium bismuth tantalate (SBT), polyvinylidene fluoride (PVDF), and its copolymers, zirconium oxide ($ZrO_2$), hafnium oxide ($HfO_2$) having a non-centrosymmetric orthorhombic phase, and their doped variants such as zirconium doped hafnium oxide (HZO), aluminum doped hafnium oxide (HfAlO), and lanthanum doped hafnium oxide (HfLaO).

Alternatively, the first gate dielectric material of the lower gate dielectric layer 30 may comprise a dielectric material that may be programmed to trap or not to trap electrical charge therein. In this case, the first gate dielectric material of the lower gate dielectric layer 30 may comprise a combination of a tunneling dielectric layer (e.g., silicon oxide), a charge storage layer (e.g., a silicon nitride layer), and a blocking dielectric layer (e.g., silicon oxide or dielectric metal oxide). Yet alternately, the first gate dielectric material of the lower gate dielectric layer 30 may comprise a resistive memory material that may form programmable conductive filaments or oxygen-depleted regions, such as nickel oxide or hafnium oxide.

Figure 10A:
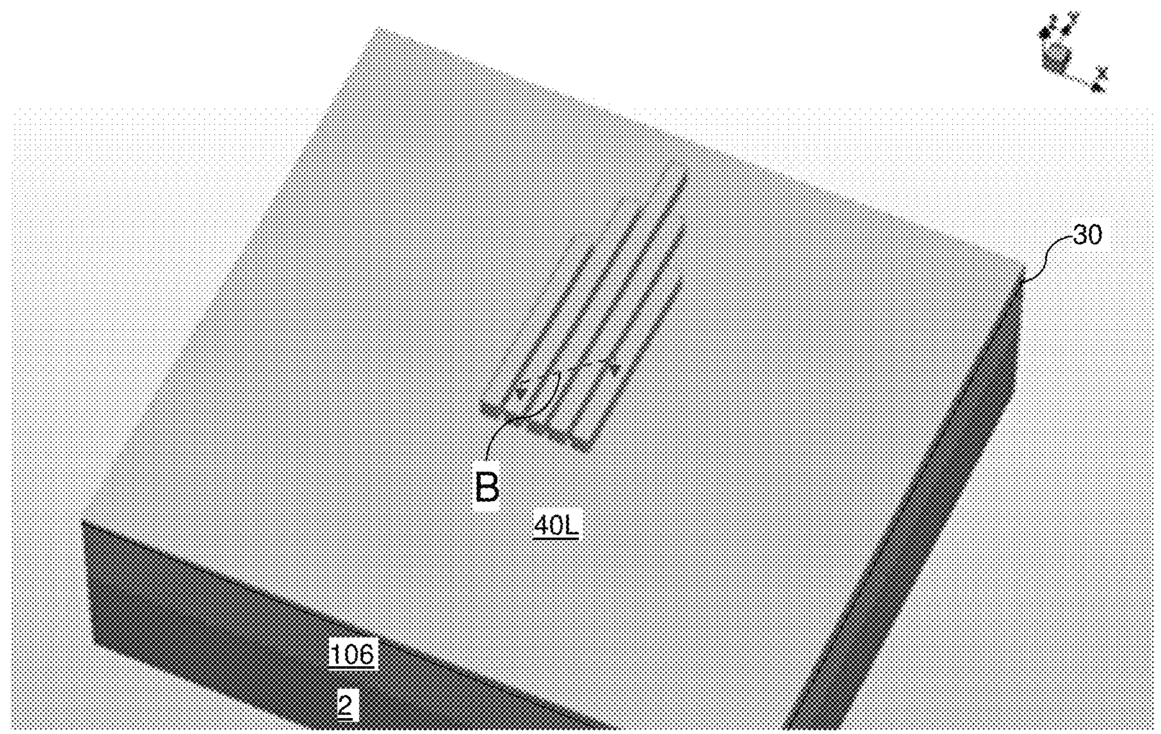
FIG. 10A is a perspective view of the exemplary structure after formation of a lower gate electrode material layer according to an embodiment of the present disclosure.
Figure 10B:
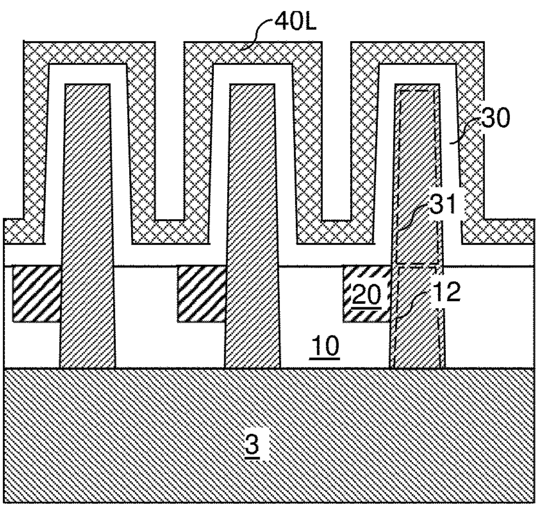
FIG. 10B is a vertical cross-sectional view of a region of the first exemplary structure along the vertical cut plane B of FIG. 10A.

Referring to FIGS. 10A and 10B, at least one electrically conductive material can be conformally deposited over the lower gate dielectric layer 30 to form a lower gate electrode material layer 40L. The lower gate electrode material layer 40L comprises a horizontally-extending portion extending over the base dielectric layer 10 and the dielectric material portion 106, vertically-extending portions contacting a respective outer sidewall of the lower gate dielectric layer 30, and strip-shaped capping portions that overlie a combination of a column of lower semiconductor pillars 31 and a column of first dielectric pillars 32. A thickness of the lower gate electrode material layer 40L can be selected such that neighboring vertically-extending portions of the lower gate electrode material layer 40L located between a neighboring pairs of columns of lower semiconductor pillars 31 do not contact each other. Thus, a gap that laterally extends along the second horizontal direction (such as the y-direction) can be present between each neighboring pair of vertically-extending portions of the lower gate electrode material layer 40L. The lower gate electrode material layer 40L may comprise at least one metallic material (e.g., W, TiN and/or WN) and/or at least one heavily doped semiconductor material (e.g., heavily doped polysilicon). The thickness of the lower gate electrode material layer 40L may be in a range from 10 nm to 200 nm, although lesser and greater thicknesses may also be employed.

Figure 11A:
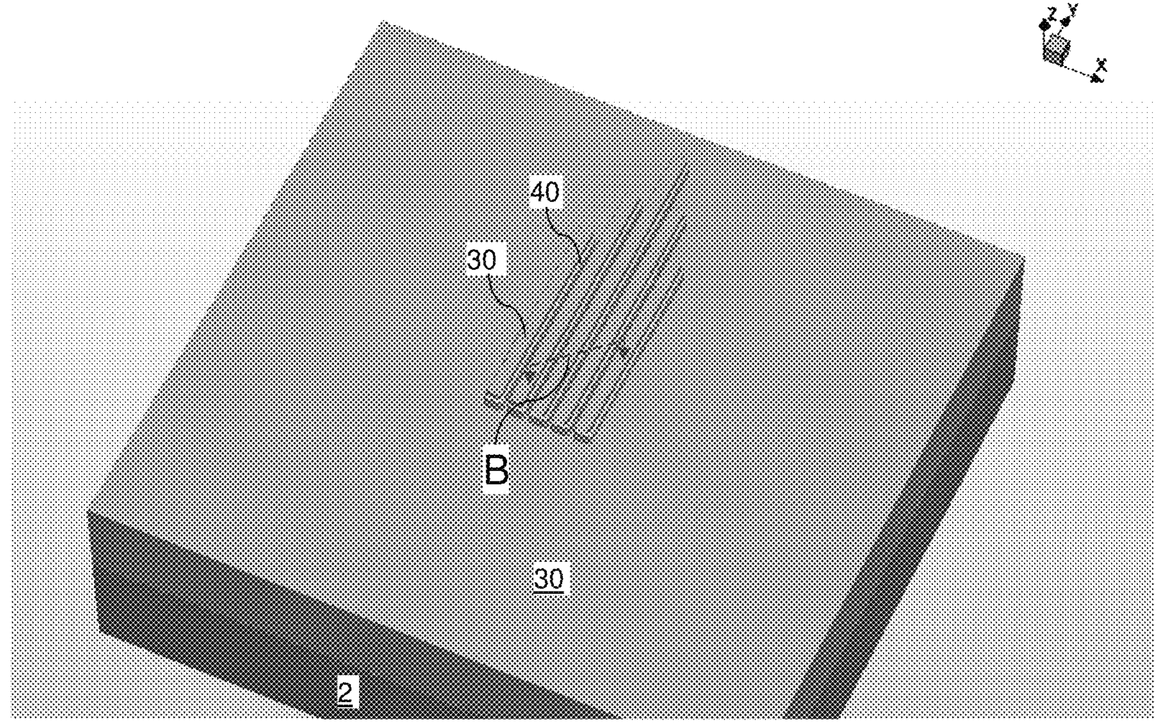
FIG. 11A is a perspective view of the exemplary structure after formation of lower gate electrode lines according to an embodiment of the present disclosure.
Figure 11B:
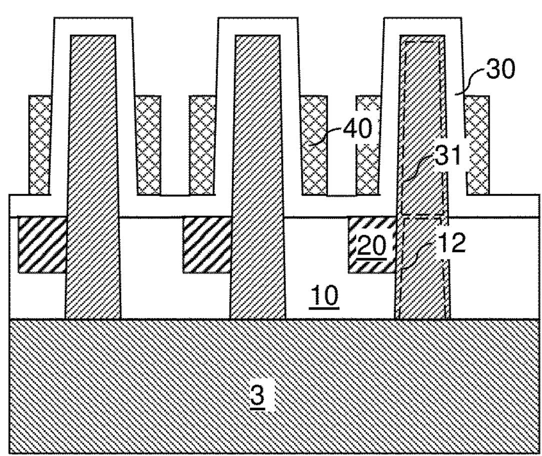
FIG. 11B is a vertical cross-sectional view of a region of the first exemplary structure along the vertical cut plane B of FIG. 11A.

Referring to FIGS. 11A and 11B, an anisotropic sidewall spacer etch process can be performed to remove the horizontally-extending portion and the strip-shaped capping portions of the lower gate electrode material layer 40L. In one embodiment, the anisotropic etch process may be selective to the material of the lower gate dielectric layer 30. Each remaining vertically extending (e.g., sidewall spacer) portion of the lower gate electrode material layer 40L comprises a lower gate electrode line 40. In one embodiment, each lower gate electrode line 40 may laterally surround a respective contiguous combination of a column of lower semiconductor pillars 31, a column of first dielectric pillars 32, and a first dielectric material rail 35, and may be shaped like an elongated rectangular frame. As such, each lower gate electrode line 40 may be topologically homeomorphic to a torus. Each lower gate electrode line 40 may comprise a pair of lengthwise rails and a pair of end rails that are adjoined to each other. In one embodiment, the duration of the anisotropic etch process may be selected such that top surfaces of the lower gate electrode lines 40 are recessed below the horizontal plane including the top surfaces of the lower semiconductor pillars 31.

The lower gate electrode lines 40 overlie the bottom bit lines 20, and are laterally spaced from sidewall segments of a respective column of the lower semiconductor pillars 31 by the lower gate dielectric layer 30. Each of the lower gate electrode lines 40 is laterally spaced from a respective column of the lower semiconductor pillars 31 by a respective vertically-extending portion of the lower gate dielectric layer 30. In one embodiment, each of the lower semiconductor pillars 31 comprises a first pillar sidewall and a second pillar sidewall that are laterally spaced from each other and laterally extend along the second horizontal direction (such as the y-direction). In one embodiment, the first pillar sidewall contacts an inner sidewall of a first vertically-extending portion of the lower gate dielectric layer 30, and the second pillar sidewall contacts an inner sidewall of a second vertically-extending portion of the lower gate dielectric layer 30. In one embodiment, a first horizontally-extending portion of one of the lower gate electrode lines 40 contacts an outer sidewall of the first vertically-extending portion of the lower gate dielectric layer 30, and a second horizontally-extending portion of said one of the lower gate electrode lines 40 contacts an outer sidewall of the second vertically-extending portion of the lower gate dielectric layer 30.

Figure 12A:
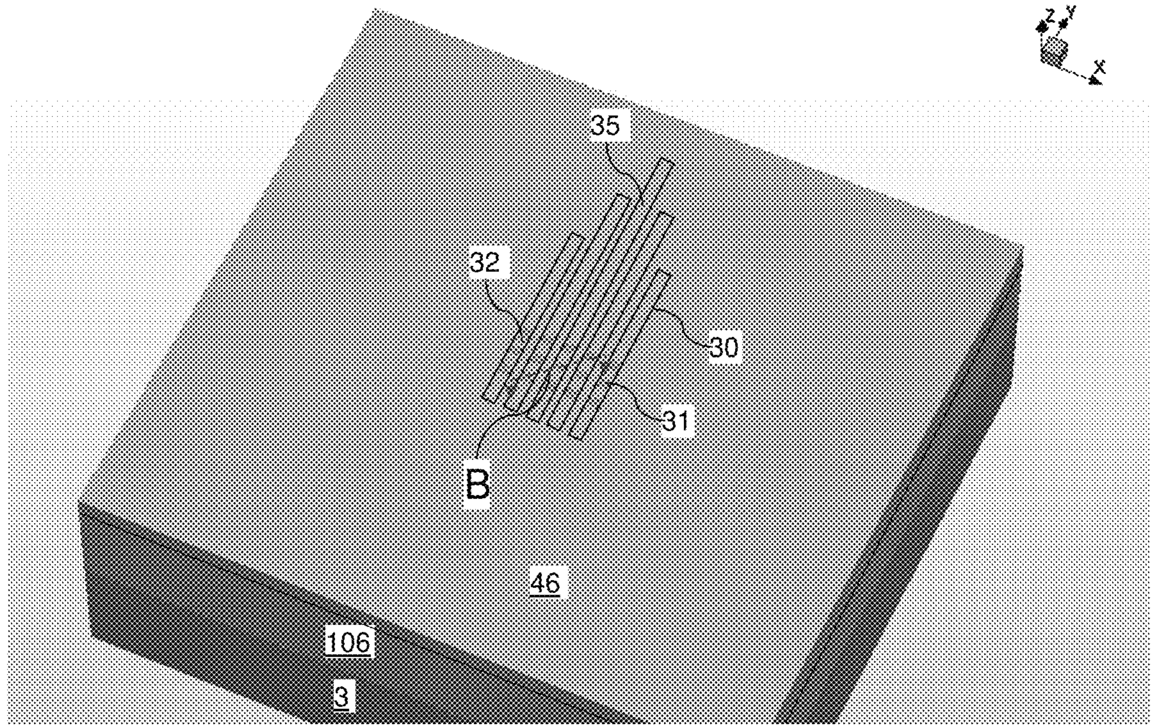
FIG. 12A is a perspective view of the exemplary structure after formation of a lower dielectric matrix layer according to an embodiment of the present disclosure.
Figure 12B:
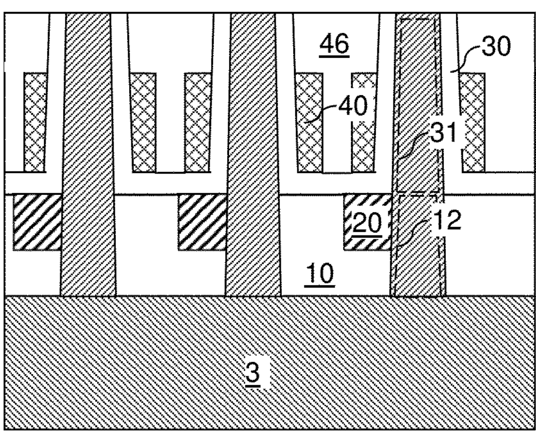
FIG. 12B is a vertical cross-sectional view of a region of the first exemplary structure along the vertical cut plane B of FIG. 12A.

Referring to FIGS. 12A and 12B, a planarizable dielectric material, such as silicate glass, can be deposited over the lower gate electrode lines 40 and the dielectric material portion 106. A planarization process can be performed to remove portions of the planarizable dielectric material and the lower gate dielectric layer 30 from above the horizontal plane including the top surfaces of the lower semiconductor pillars 31, for example, by performing a chemical mechanical polishing process. The remaining portion of the planarizable dielectric material constitutes a lower dielectric matrix layer 46. The top surface of the lower dielectric matrix layer 46 may be formed within the horizontal plane including the top surfaces of the lower semiconductor pillars 31. Upon formation of the lower dielectric matrix layer 46, the lower gate dielectric layer 30 comprises a horizontally-extending portion and vertically-extending portions that are adjoined to, and protrude upward from, the horizontally-extending portion. Top surface segments of the vertically-extending portions of the lower gate dielectric layer 30 can be physically exposed within the horizontal plane including the top surface of the lower dielectric matrix layer 46. Each top surface segment of a vertically-extending portion of the lower gate dielectric layer 30 may have a shape of a rectangular frame in a plan view such as a top-down view.

Figure 13:
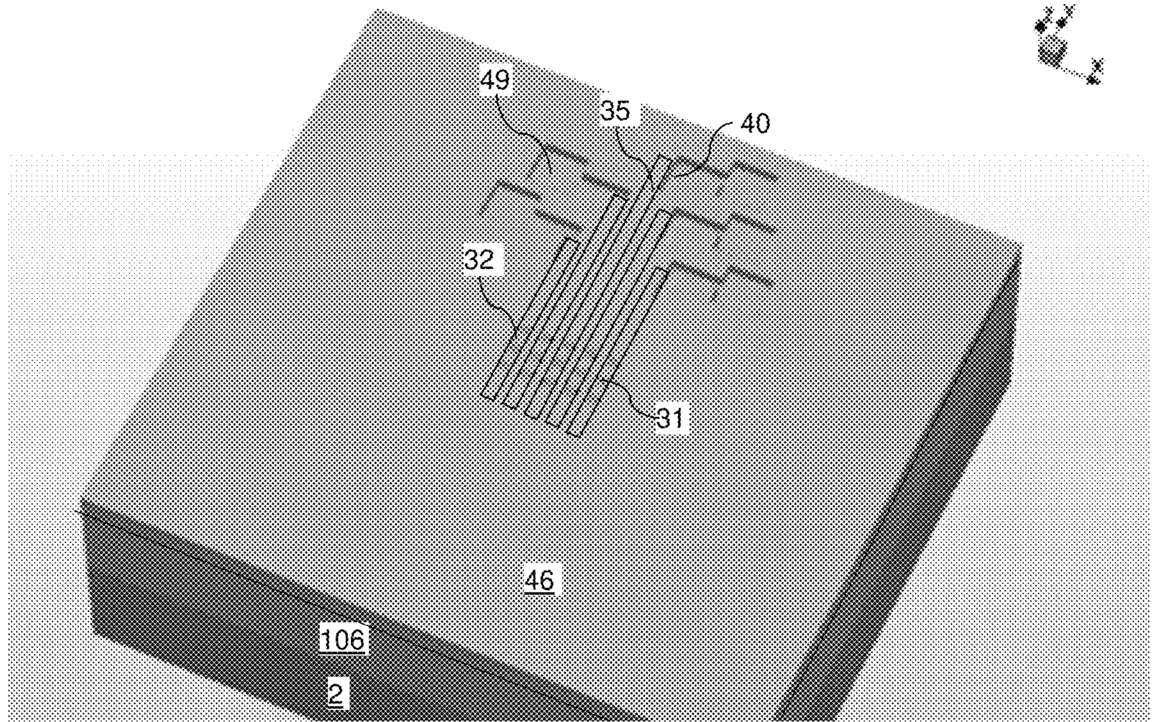
FIG. 13 is a perspective view of the exemplary structure after formation of lower gate contact cavities according to an embodiment of the present disclosure.

Referring to FIG. 13, lower gate contact cavities 49 can be patterned in an upper portion of the lower dielectric matrix layer 46 over the dielectric material portions 106. The shape of each lower gate contact cavity 49 may comprise a combination of a shape of a line cavity to which a lower gate electrode line 40 is exposed and a shape of a pad cavity that is adjoined to an end portion of the line cavity.

Figure 14A:
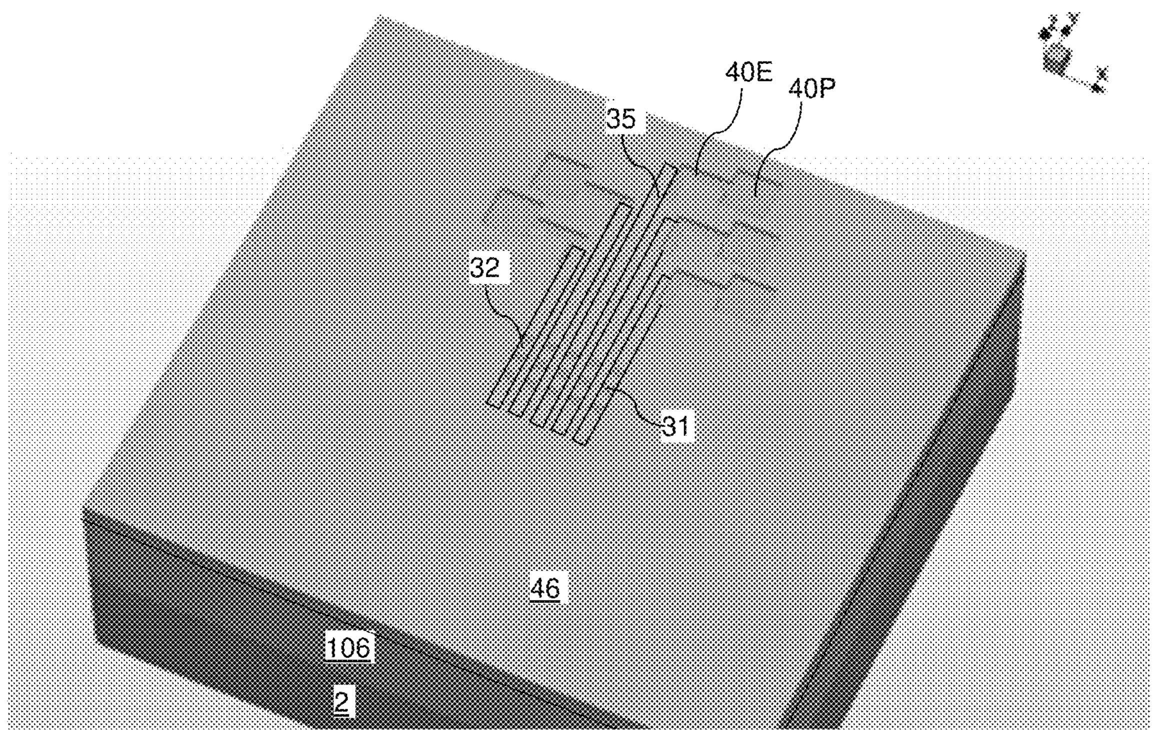
FIG. 14A is a perspective view of the exemplary structure after formation of lower gate line extensions and lower gate contact pads according to an embodiment of the present disclosure.
Figure 14B:
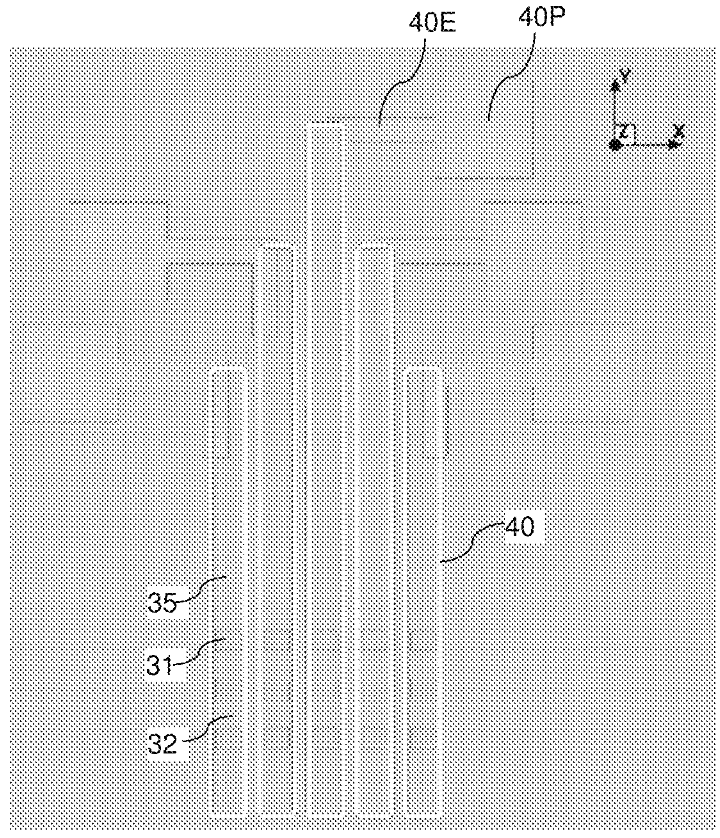
FIG. 14B is plan view of a region of the first exemplary structure in which structures embedded in the lower dielectric matrix layer are shown.

Referring to FIGS. 14A and 14B, at least one electrically conductive material can be deposited in the lower gate contact cavities 49. Excess portions of the at least one electrically conductive material can be removed from above the horizontal plane including the top surface of the lower dielectric matrix layer 46 by performing a planarization process, which may comprise a chemical mechanical polishing process and/or a recess etch process. Subsequently, the at least one electrically conductive material portion can optionally be vertically recessed such that remaining portions of the at least one electrically conductive material have top surfaces below a horizontal plane including the top surfaces of the lower dielectric matrix layer 46. Each remaining portion of the at least one electrically conductive material that fills a respective lower gate contact cavity 49 comprises a combination of a lower gate electrode extension 40E and a lower gate electrode contact pad 40P. Each lower gate electrode extension 40E may contact a respective one of the lower gate electrode line 40.

Figure 15:
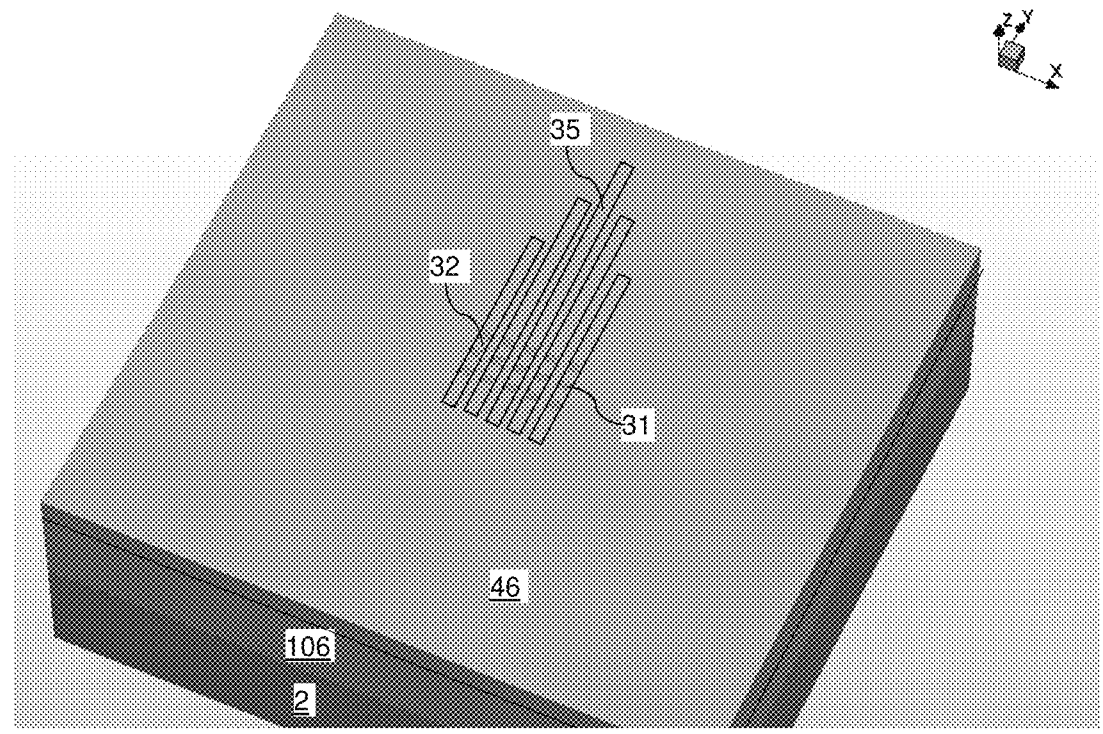
FIG. 15 is a perspective view of the exemplary structure after formation of lower dielectric capping material portions according to an embodiment of the present disclosure.

Referring to FIG. 15, a dielectric fill material can be deposited in remaining volumes of the lower gate contact cavities 49. Excess portions of the dielectric fill material can be removed from above the horizontal plane including the top surface of the lower dielectric matrix layer 46. Remaining portions of the dielectric fill material can be incorporated into the lower dielectric matrix layer 46, and can cover the lower gate electrode extensions 40E and the lower gate electrode contact pads 40P.

Figure 16A:
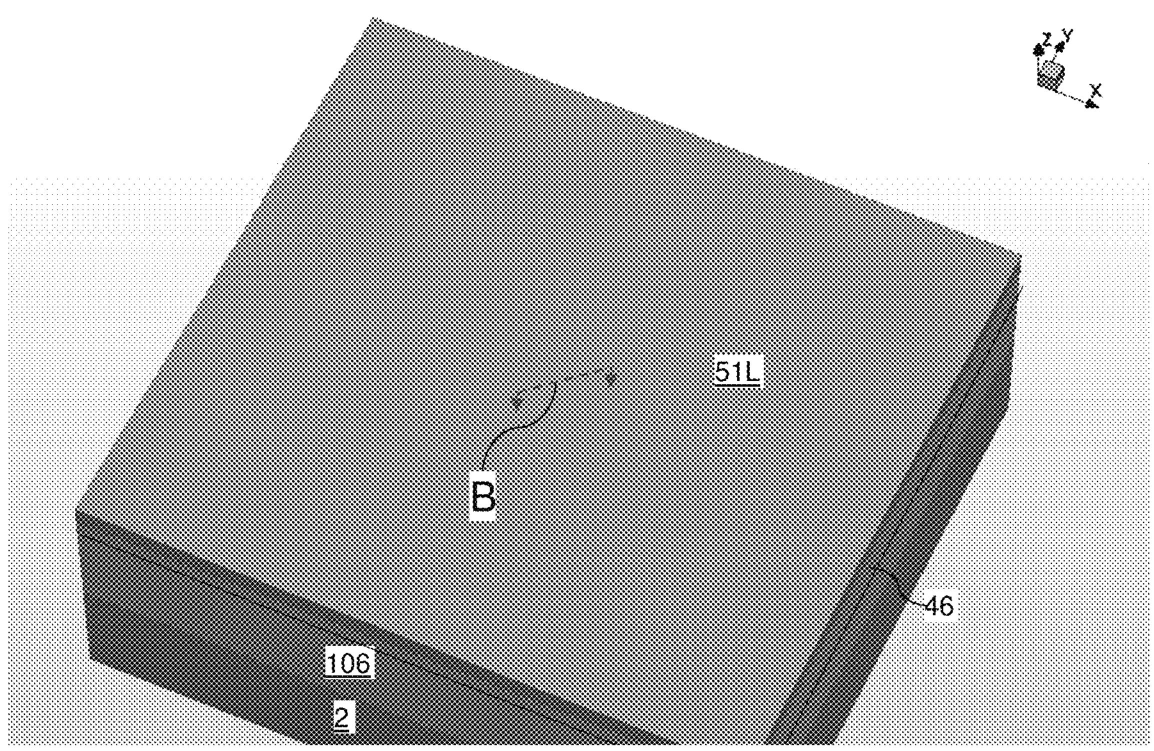
FIG. 16A is a perspective view of the exemplary structure after formation of a polycrystalline semiconductor material layer according to an embodiment of the present disclosure.
Figure 16B:
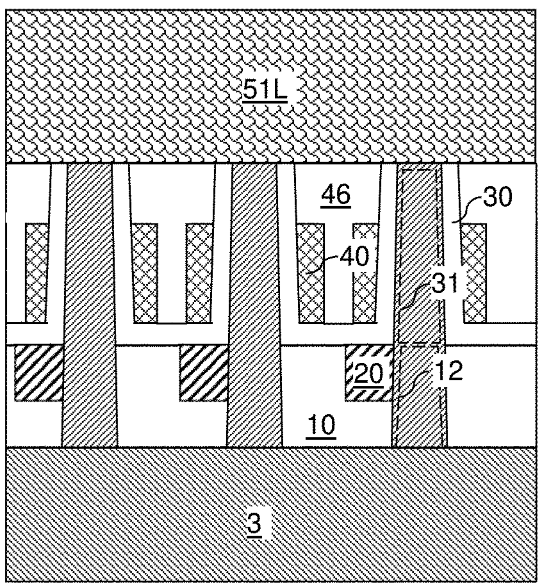
FIG. 16B is a vertical cross-sectional view of a region of the first exemplary structure along the vertical cut plane B of FIG. 16A.

Referring to FIGS. 16A and 16B, a polycrystalline semiconductor material layer 51L can be deposited over the lower dielectric matrix layer 46. The polycrystalline semiconductor material layer 51L comprises a polycrystalline semiconductor material such as polysilicon, polycrystalline silicon-germanium, or another polycrystalline compound semiconductor material. The polycrystalline semiconductor material layer 51L may be suitably doped with first or second conductivity type dopants to provide a desired electrical conductivity for vertical semiconductor channels of an array of upper field effect transistors to be subsequently formed. The thickness of the polycrystalline semiconductor material layer 51L may be in a range from 100 nm to 3,000 nm, although lesser and greater thicknesses may also be employed.

Figure 17A:
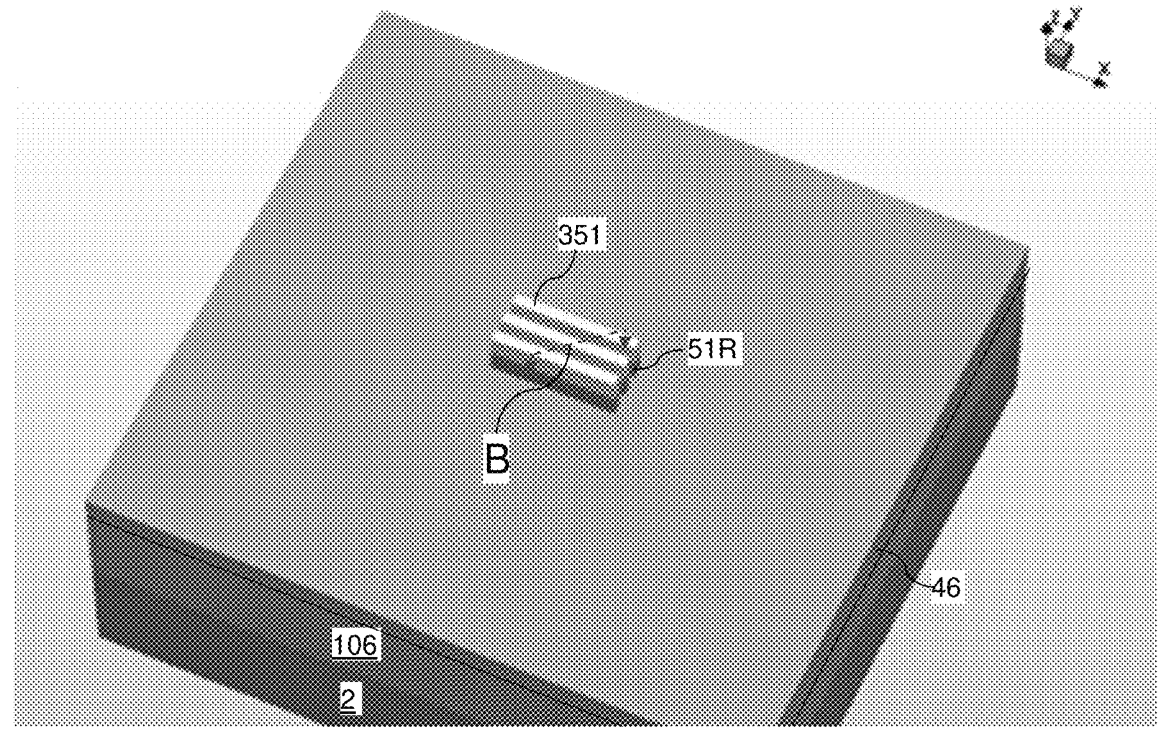
FIG. 17A is a perspective view of the exemplary structure after formation of polycrystalline semiconductor rails according to an embodiment of the present disclosure.
Figure 17B:
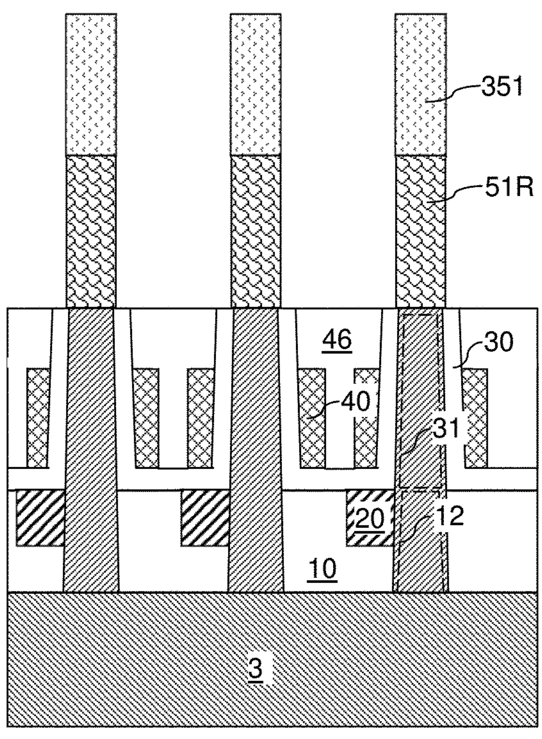
FIG. 17B is a vertical cross-sectional view of a region of the first exemplary structure along the vertical cut plane B of FIG. 17A.

Referring to FIGS. 17A and 17B, a photoresist layer can be applied over the polycrystalline semiconductor material layer 51L, and can be lithographically patterned to form third line-shaped photoresist material portions 351 arranged in a periodic line pattern. Each third line-shaped photoresist material portion 351 may laterally extend along the first horizontal direction (such as the x-direction) and can be laterally spaced apart along the second horizontal direction (such as the y-direction). The third line-shaped photoresist material portion 351 may be periodic along the second horizontal direction. The width of each third line-shaped photoresist material portion 351 about the same of the width of each lower semiconductor pillar 31 along the second horizontal direction, and may be in a range from 10 nm to 200 nm, although lesser and greater widths may also be employed. The spacing between each neighboring pair of third line-shaped photoresist material portions 351 may be in a range from 50 nm to 500 nm, although lesser and greater spacings may also be employed. In one embodiment, the area of each third line-shaped photoresist material portion 351 may overlap with the area of a respective underlying base semiconductor rail structure 12. While FIGS. 17A and 17B schematically illustrate only three of the third line-shaped photoresist material portions 351, it should be understood that the total number of third line-shaped photoresist material portions 351 may be in a range from 2 to $2^{20}$, and may be selected based on the performance requirement of the memory array to be subsequently formed. In one embodiment, the total number of the third line-shaped photoresist material portion 351 may be the same as the total number of the base semiconductor rail structures 12.

An anisotropic etch process can be performed to transfer the pattern of the third line-shaped photoresist material portion 351 into the polycrystalline semiconductor material layer 51L. Unmasked portions of the semiconductor material of the polycrystalline semiconductor material layer 51L can be anisotropically etched selectively to the material of the lower dielectric matrix layer 46. Patterned portions of the polycrystalline semiconductor material layer 51L comprise polycrystalline semiconductor rails 51R that laterally extend along the first horizontal direction (such as the x-direction). The polycrystalline semiconductor rails 51R may have a respective width in a range from 10 nm to 200 nm, although lesser and greater widths may also be employed. The height of each polycrystalline semiconductor rail 51R may be in a range from 100 nm to 3,000 nm, such as from 300 nm to 1,000 nm, although lesser and greater thicknesses may also be employed. The third line-shaped photoresist material portion 351 can be subsequently removed, for example, by ashing.

Figure 18A:
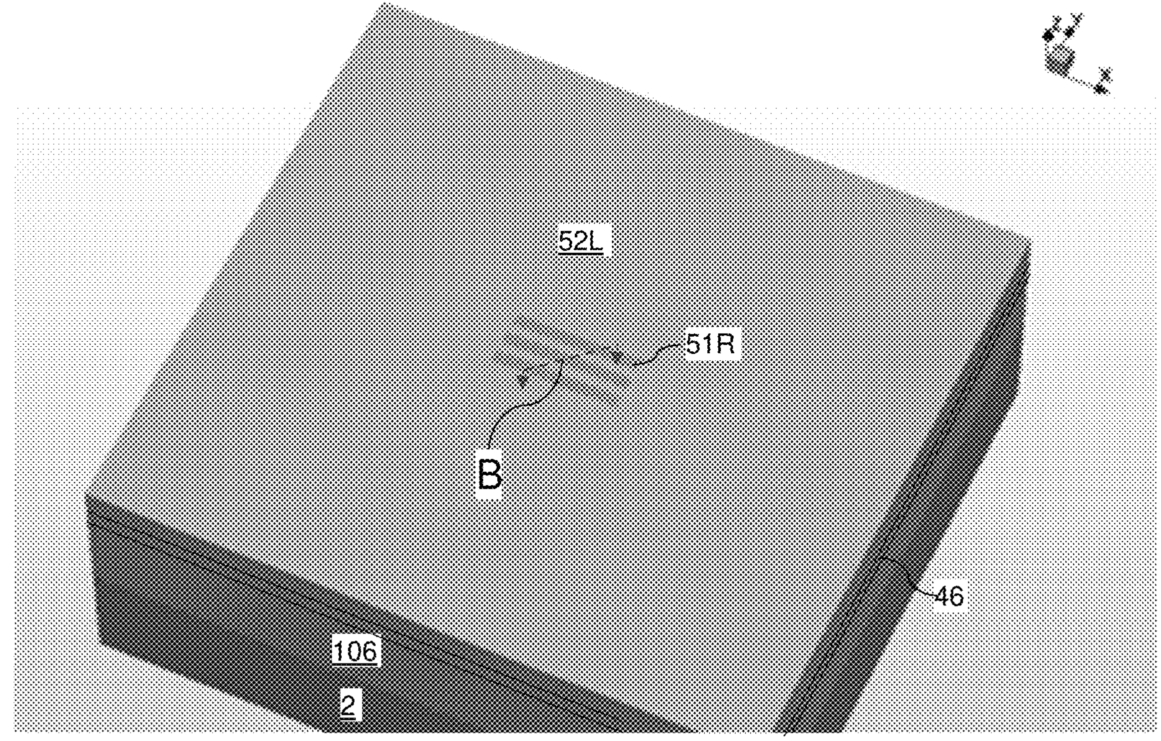
FIG. 18A is a perspective view of the exemplary structure after formation of a pillar dielectric material layer according to an embodiment of the present disclosure.
Figure 18B:
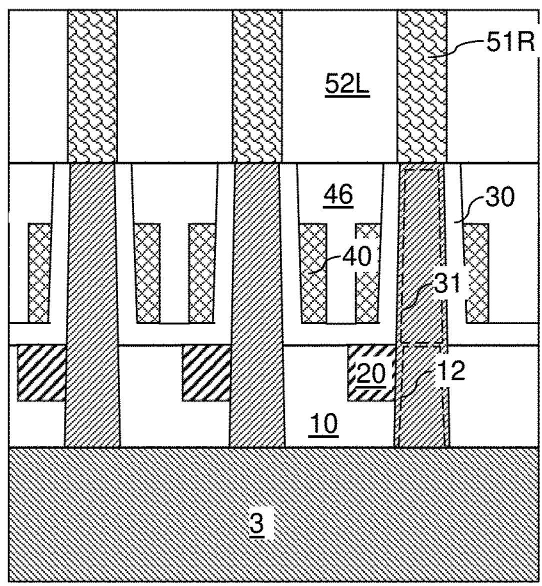
FIG. 18B is a vertical cross-sectional view of a region of the first exemplary structure along the vertical cut plane B of FIG. 18A.

Referring to FIGS. 18A and 18B, a dielectric fill material, such as silicate glass, can be deposited over and around the polycrystalline semiconductor rails 51R. A planarization process, such as a chemical mechanical polishing process and/or a recess etch process, can be performed to remove the portion of the dielectric fill material that is located above the horizontal plane including the top surfaces of the polycrystalline semiconductor rails 51R. The remaining portion of the dielectric fill material that laterally surrounds the polycrystalline semiconductor rails 51R comprise a pillar dielectric material layer 52L.

Figure 19A:
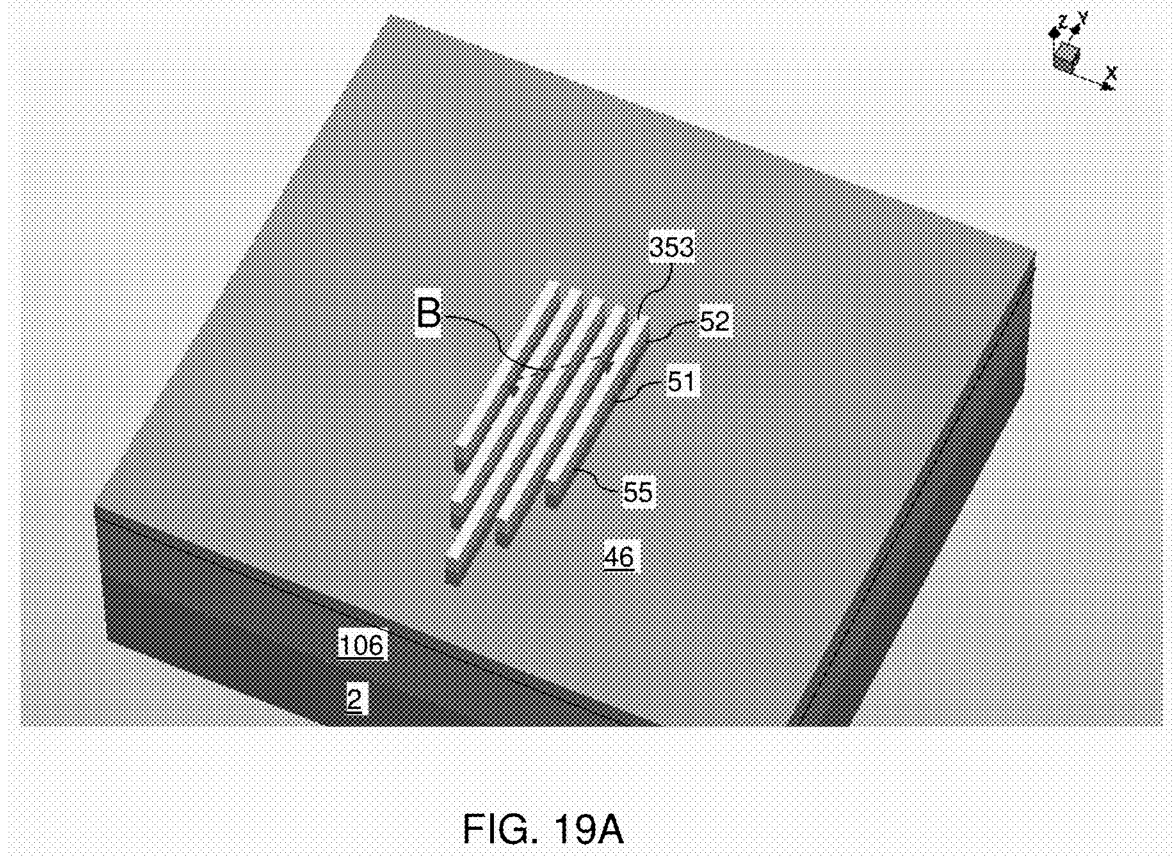
FIG. 19A is a perspective view of the exemplary structure after formation of a two-dimensional array of upper semiconductor pillars and a two-dimensional array of second dielectric pillars according to an embodiment of the present disclosure.
Figure 19B:
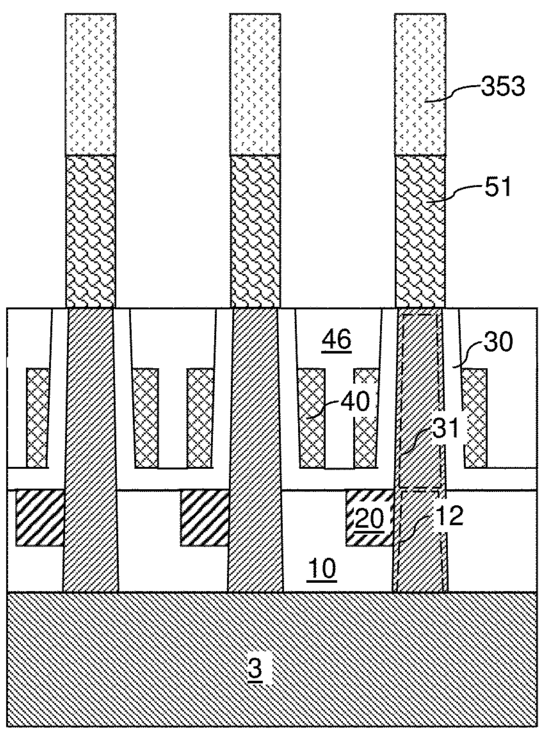
FIG. 19B is a vertical cross-sectional view of a region of the first exemplary structure along the vertical cut plane B of FIG. 19A.

Referring to FIGS. 19A and 19B, a photoresist layer can be applied over the top surfaces of the polycrystalline semiconductor rails 51R and the pillar dielectric material layer 52L, and can be lithographically patterned to form fourth line-shaped photoresist material portions 353 arranged in a periodic line pattern. Each fourth line-shaped photoresist material portion 353 may laterally extend along the second horizontal direction (such as the y-direction) and can be laterally spaced apart along the first horizontal direction (such as the x-direction). The fourth line-shaped photoresist material portion 353 may be periodic along the first horizontal direction. The width of each fourth line-shaped photoresist material portion 353 may be in a range from 10 nm to 200 nm, although lesser and greater widths may also be employed. The spacing between each neighboring pair of fourth line-shaped photoresist material portions 353 may be in a range from 50 nm to 500 nm, although lesser and greater spacings may also be employed. In one embodiment, each fourth line-shaped photoresist material portion 353 may have an areal overlap with an underlying interlaced set of a column of lower semiconductor pillars 31 and a column of first dielectric pillars 32. While FIG. 19A schematically illustrates only five of the fourth line-shaped photoresist material portions 353, it should be understood that the total number of fourth line-shaped photoresist material portions 353 may be in a range from 2 to $2^{20}$, and may be selected based on the performance requirement of the memory array to be subsequently formed.

Subsequently, an anisotropic etch process can be performed to transfer the pattern of the fourth line-shaped photoresist material portion 353 through the polycrystalline semiconductor rails 51R and the pillar dielectric material layer 52L. Unmasked portions of the polycrystalline semiconductor rails 51R and the pillar dielectric material layer 52L can be anisotropically etched by the anisotropic etch process. Each polycrystalline semiconductor rail 51R is patterned into a row of upper semiconductor pillars 51 arranged along the first horizontal direction (such as the x-direction). Unmasked portions of the pillar dielectric material layer 52L can be removed by the anisotropic etch process, and a top surface of the lower dielectric matrix layer 46 can be physically exposed. Masked portions of the pillar dielectric material layer 52L that underlie the fourth line-shaped photoresist material portion 353 and are located in the memory array region form a two-dimensional array second dielectric pillars 52. A two-dimensional array of second dielectric pillars 52 is interlaced with the two-dimensional array of upper semiconductor pillars 51. Masked portions of the pillar dielectric material layer 52L that underlie the fourth line-shaped photoresist material portion 353 form second dielectric material rails 55. The fourth line-shaped photoresist material portion 353 can be subsequently removed, for example, by ashing.

In summary, a two-dimensional array of upper semiconductor pillars 51 is formed. Each of the upper semiconductor pillars 51 is formed directly on a top surface of a respective one of the lower semiconductor pillars 31. In one embodiment, each of the upper semiconductor pillars 51 may contact the entirety of the top surface of a respective one of the lower semiconductor pillars 31. A two-dimensional array of second dielectric pillars 52 can be interlaced with the two-dimensional array of upper semiconductor pillars 51. Each of the second dielectric pillars 52 may contact the top surfaces of a respective underlying first dielectric pillar 32.

Figure 20A:
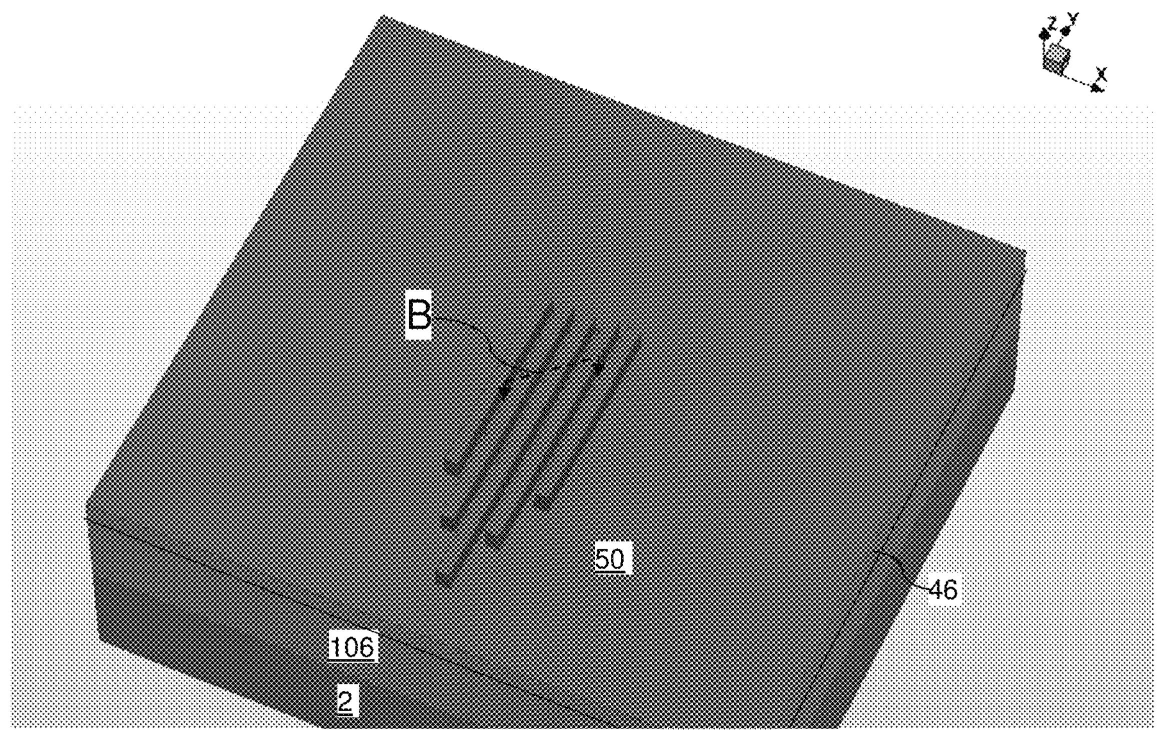
FIG. 20A is a perspective view of the exemplary structure after formation of an upper gate electrode material layer according to an embodiment of the present disclosure.
Figure 20B:
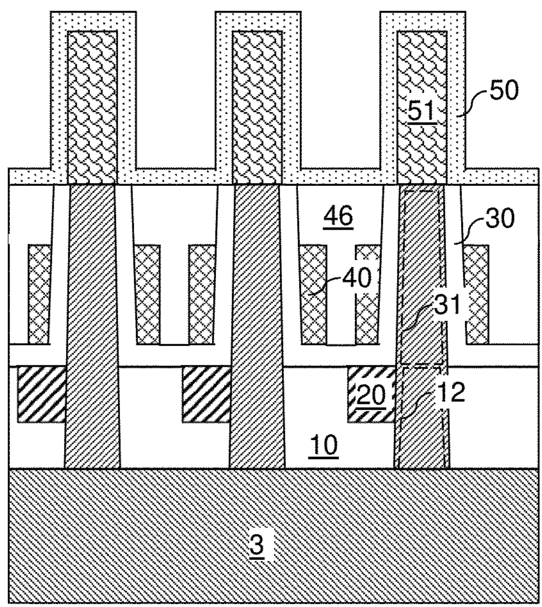
FIG. 20B is a vertical cross-sectional view of a region of the first exemplary structure along the vertical cut plane B of FIG. 20A.

Referring to FIGS. 20A and 20B, an upper gate dielectric layer 50 can be formed by conformally depositing a second gate dielectric material over the physically exposed surfaces of the two-dimensional array of upper semiconductor pillars 51 and the two-dimensional array of second dielectric pillars 52 and on the physically exposed horizontal surfaces of the upper dielectric matrix layer 66. Generally, the upper gate dielectric layer 50 comprises a horizontally-extending portion and vertically-extending portions that are adjoined to and protrude upward from the horizontally-extending portion. The second gate dielectric material may comprise the above described non-volatile memory material if the first gate dielectric layer 30 is a non-memory material layer (i.e., if layer 30 is free of memory material). Alternatively, the second gate dielectric material may comprise a non-memory material layer (i.e., may be free of any memory material) if the first gate dielectric layer 30 is a memory material layer. The upper gate dielectric layer 50 on sidewall segments of the upper semiconductor pillars 51. Top surface segments of the vertically-extending portions of the lower gate dielectric layer 30 contact a bottom surface of a horizontally-extending portion of the upper gate dielectric layer 50. The thickness of the upper gate dielectric layer 50 may be selected based on the operating voltage of a two-dimensional array of upper transistors to be subsequently formed, and may be in a range from 1 nm to 50 nm, such as from 4 nm to 10 nm, although lesser and greater thicknesses may also be employed. Vertically extending portions of the upper gate dielectric layer 50 that laterally extends along the second horizontal direction laterally contacts a respective column of second dielectric pillars 52 within the two-dimensional array of second dielectric pillars 52.

According to an aspect of the present disclosure, one of the first gate dielectric material of the lower gate dielectric layer 30 and the second gate dielectric material of the upper gate dielectric layer 50 comprises a non-volatile memory material, and another of the first gate dielectric material of the lower gate dielectric layer 30 and the second gate dielectric material of the upper gate dielectric layer 50 is free of any memory material (i.e., consists of at least one non-memory dielectric material), and thus, does not provide any hysteresis effect and does not store data therein. In other words, one of the lower gate dielectric layer 30 and the upper gate dielectric layer 50 comprises a non-volatile memory material, and another of the lower gate dielectric layer 30 and the upper gate dielectric layer 50 is free of any memory material.

The lower gate dielectric layer 30 and the upper gate dielectric layer 50 are employed to form a two-dimensional array of vertical stacks of a first field effect transistor (i.e., a lower field effect transistor) employing portions of the lower gate dielectric layer 30 as a respective gate dielectric and a second field effect transistor (i.e., an upper field effect transistor) employing portions of the upper gate dielectric layer 50 as a respective gate dielectric. One of the first field effect transistor and the second field effect transistor that employs a non-volatile memory material as the material of the respective gate dielectric is a memory transistor (i.e., a write transistor) that can store a data bit within the non-volatile memory material. Another one of the first field effect transistor and the second field effect transistor that employs a non-memory material as the material of the respective gate dielectric is an access transistor (i.e., a read access transistor) that is employed to control electrical access to the field effect transistor including the non-volatile memory material. In one embodiment, the lower field effect transistor employing a portion of the lower gate dielectric layer 30 as a gate dielectric is the access transistor and the upper field effect transistor employing a portion of the upper gate dielectric layer 50 as a gate dielectric is the memory transistor. Alternatively, the lower field effect transistor employing a portion of the lower gate dielectric layer 30 as a gate dielectric is the memory transistor and the upper field effect transistor employing a portion of the upper gate dielectric layer 50 as a gate dielectric is the access transistor.

Figure 21A:
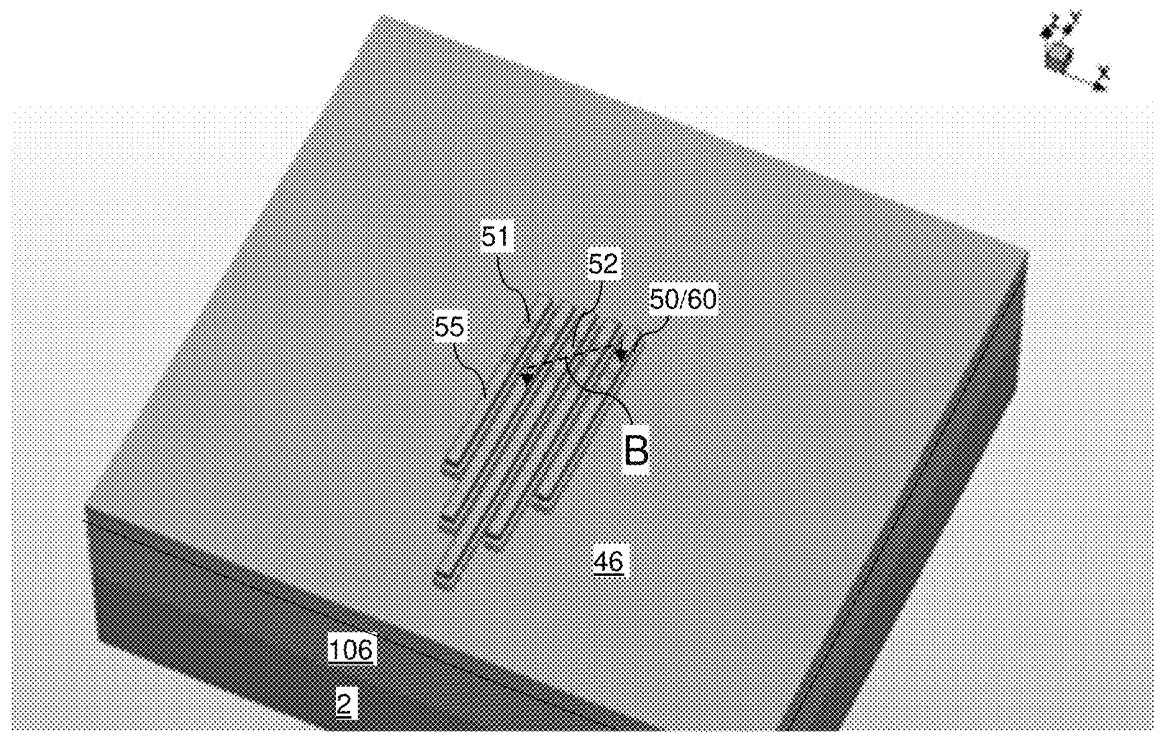
FIG. 21A is a perspective view of the exemplary structure after formation of upper gate electrode lines according to an embodiment of the present disclosure.
Figure 21B:
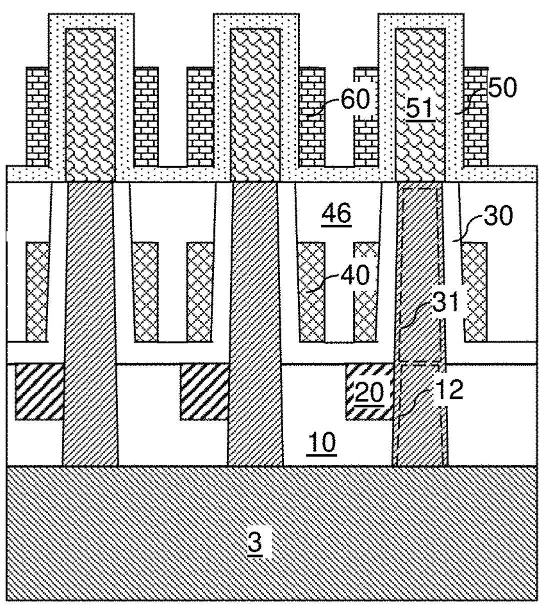
FIG. 21B is a vertical cross-sectional view of a region of the first exemplary structure along the vertical cut plane B of FIG. 21A.

Referring to FIGS. 21A and 21B, at least one electrically conductive material can be conformally deposited over the upper gate dielectric layer 50 to form an upper gate electrode material layer. The upper gate electrode material layer comprises a horizontally-extending portion, vertically-extending portions contacting a respective outer sidewall of the upper gate dielectric layer 50, and strip-shaped capping portions that overlie a combination of a column of upper semiconductor pillars 51 and a column of second dielectric pillars 52. The thickness of the upper gate electrode material layer can be selected such that neighboring vertically-extending portions of the upper gate electrode material layer located between a neighboring pairs of columns of upper semiconductor pillars 51 do not contact each other. Thus, a gap that laterally extends along the second horizontal direction (such as the y-direction) can be present between each neighboring pair of vertically-extending portions of the upper gate electrode material layer. The upper gate electrode material layer may comprise at least one metallic material (e.g., W, TiN, WN, etc.) and/or at least one doped semiconductor material (e.g., heavily doped polysilicon). The thickness of the upper gate electrode material layer may be in a range from 10 nm to 400 nm, although lesser and greater thicknesses may also be employed.

An anisotropic sidewall spacer etch process can be performed to remove the horizontally-extending portion and the strip-shaped capping portions of the upper gate electrode material layer. In one embodiment, the anisotropic etch process may be selective to the material of the upper gate dielectric layer 50. Each remaining vertically extending portion of the upper gate electrode material layer comprises an upper gate electrode line 60. In one embodiment, each upper gate electrode line 60 may laterally surround a respective contiguous combination of a column of upper semiconductor pillars 51, a column of second dielectric pillars 52, and a second dielectric material rail 55, and may be shaped like an elongated rectangular frame. As such, each upper gate electrode line 60 may be topologically homeomorphic to a torus. Each upper gate electrode line 60 may comprise a pair of lengthwise rails and a pair of end rails that are adjoined to each other. In one embodiment, the duration of the anisotropic etch process may be selected such that top surfaces of the upper gate electrode lines 60 are formed below the horizontal plane including the top surfaces of the upper semiconductor pillars 51.

The upper gate electrode lines 60 are laterally spaced from sidewall segments of a respective column of the upper semiconductor pillars 51 by the upper gate dielectric layer

50. Each of the upper gate electrode lines 60 is laterally spaced from a respective column of the upper semiconductor pillars 51 by a respective vertically-extending portion of the upper gate dielectric layer 50. In one embodiment, each of the upper semiconductor pillars 51 comprises a first pillar sidewall and a second pillar sidewall that are laterally spaced from each other and laterally extend along the second horizontal direction (such as the y-direction). In one embodiment, the first pillar sidewall contacts an inner sidewall of a second vertically-extending portion of the upper gate dielectric layer 50, and the second pillar sidewall contacts an inner sidewall of a second vertically-extending portion of the upper gate dielectric layer 50. In one embodiment, a first horizontally-extending portion of one of the upper gate electrode lines 60 contacts an outer sidewall of the second vertically-extending portion of the upper gate dielectric layer 50, and a second horizontally-extending portion of said one of the upper gate electrode lines 60 contacts an outer sidewall of the second vertically-extending portion of the upper gate dielectric layer 50.

Figure 22A:
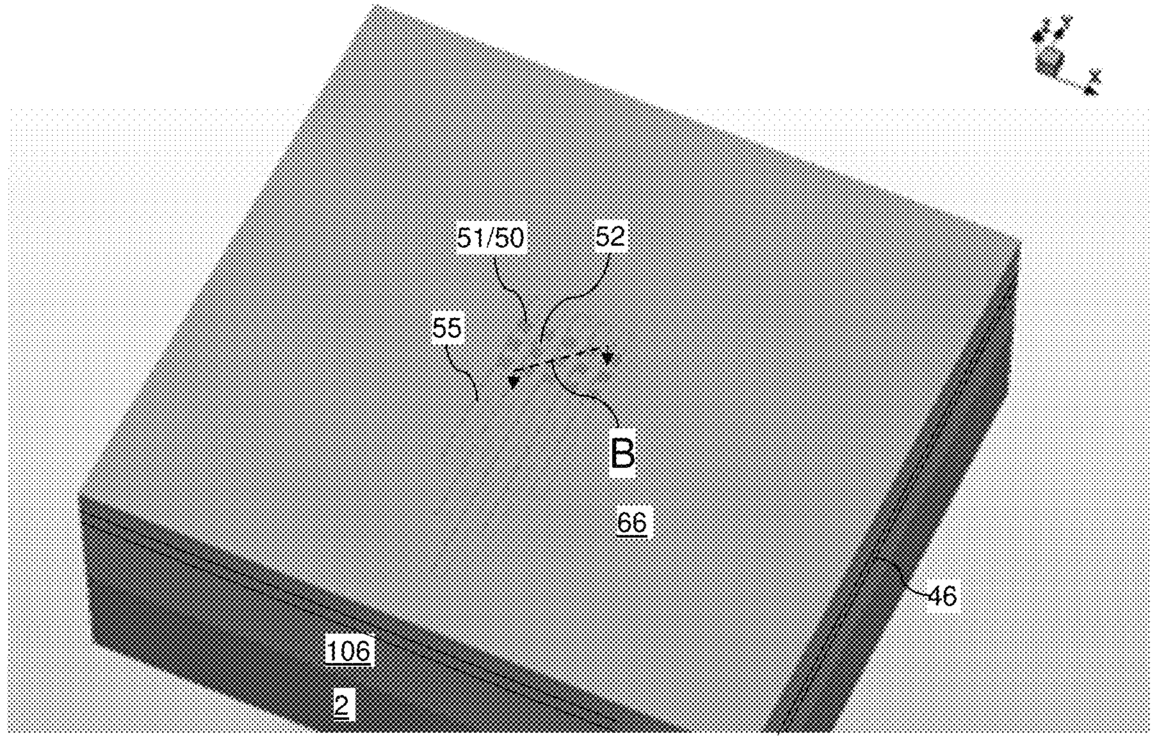
FIG. 22A is a perspective view of the exemplary structure after formation of an upper dielectric matrix layer according to an embodiment of the present disclosure.
Figure 22B:
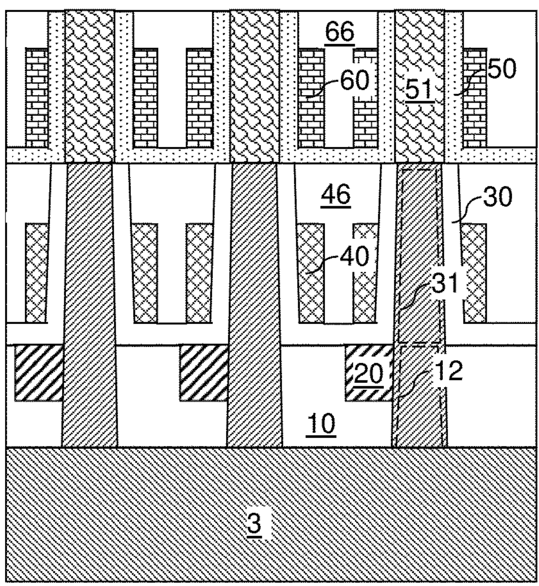
FIG. 22B is a vertical cross-sectional view of a region of the first exemplary structure along the vertical cut plane B of FIG. 22A.

Referring to FIGS. 22A and 22B, a planarizable dielectric material, such as silicate glass, can be deposited over the upper gate electrode lines 60. A planarization process can be performed to remove portions of the planarizable dielectric material and the upper gate dielectric layer 50 from above the horizontal plane including the top surfaces of the upper semiconductor pillars 51, for example, by performing a chemical mechanical polishing process. The remaining portion of the planarizable dielectric material constitutes an upper dielectric matrix layer 66. The top surface of the upper dielectric matrix layer 66 may be formed within the horizontal plane including the top surfaces of the upper semiconductor pillars 51. Upon formation of the upper dielectric matrix layer 66, the upper gate dielectric layer 50 comprises a horizontally-extending portion and vertically-extending portions that are adjoined to and protrude upward from the horizontally-extending portion. Top surface segments of the vertically-extending portions of the upper gate dielectric layer 50 can be physically exposed within the horizontal plane including the top surface of the upper dielectric matrix layer 66. Each top surface segment of a vertically-extending portion of the upper gate dielectric layer 50 may have a shape of a rectangular frame in a plan view such as a top-down view.

Figure 23:
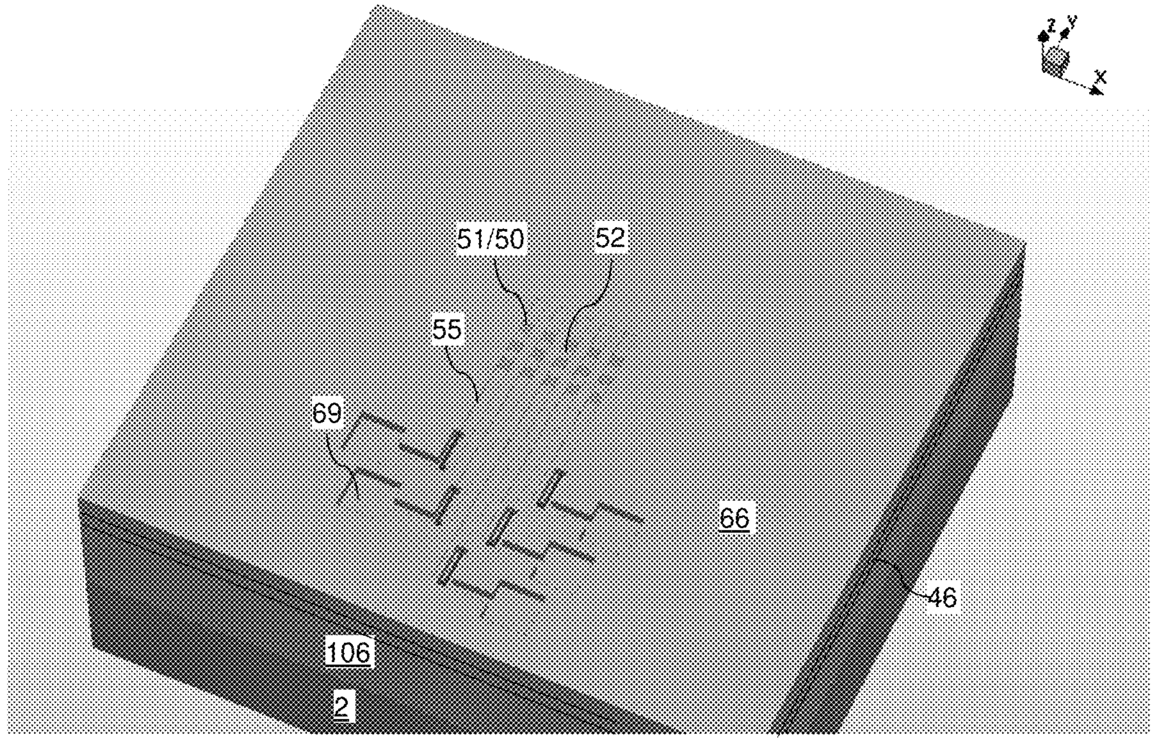
FIG. 23 is a perspective view of the exemplary structure after formation of upper gate contact cavities according to an embodiment of the present disclosure.

Referring to FIG. 23, upper gate contact cavities 69 can be patterned in an upper portion of the upper dielectric matrix layer 66. The shape of each upper gate contact cavity 69 may comprise a combination of a shape of a line cavity to which an upper gate electrode line 60 is exposed and a shape of a pad cavity that is adjoined to an end portion of the line cavity.

Figure 24A:
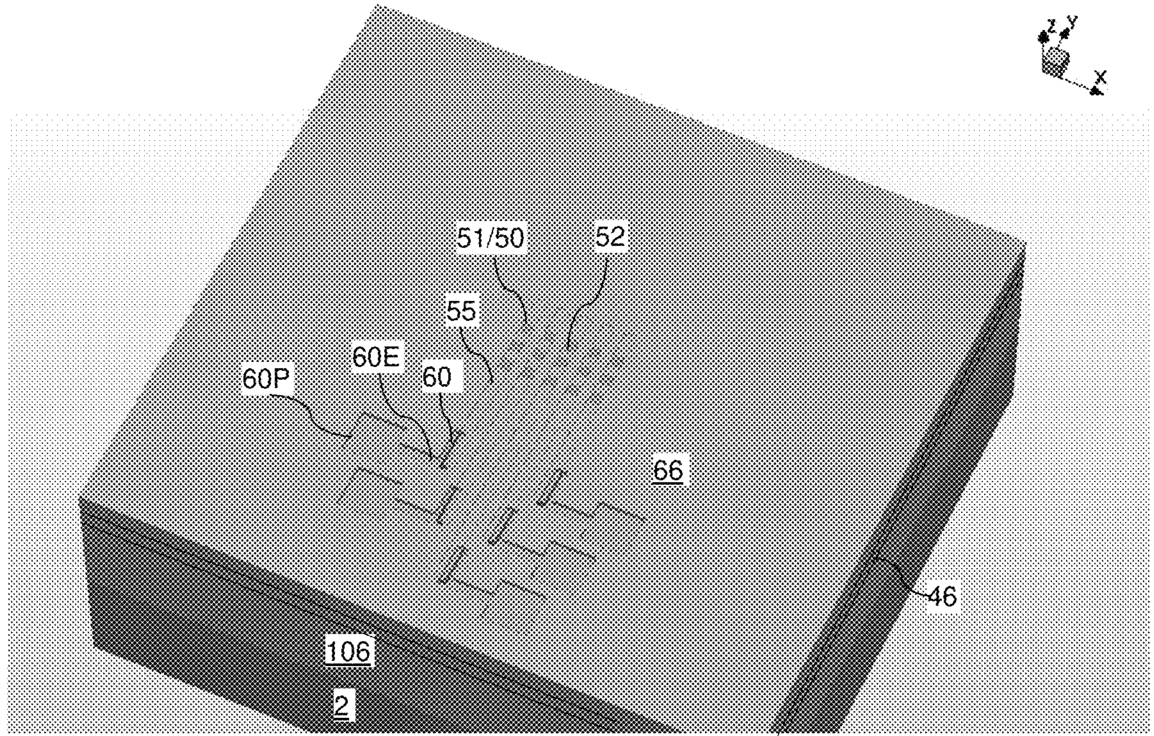
FIG. 24A is a perspective view of the exemplary structure after formation of upper gate line extensions and upper gate contact pads according to an embodiment of the present disclosure.
Figure 24B:
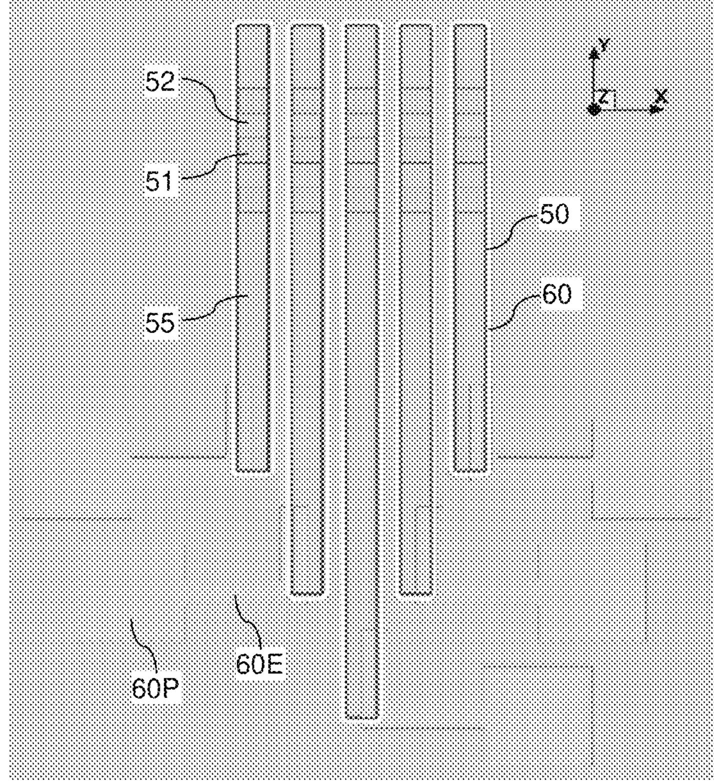
FIG. 24B is plan view of a region of the first exemplary structure in which structures embedded in the upper dielectric matrix layer are shown.

Referring to FIGS. 24A and 24B, at least one electrically conductive material can be deposited in the upper gate contact cavities 69. Excess portions of the at least one electrically conductive material can be removed from above the horizontal plane including the top surface of the upper dielectric matrix layer 66 by performing a planarization process, which may comprise a chemical mechanical polishing process and/or a recess etch process. Subsequently, the at least one electrically conductive material portion can optionally be vertically recessed such that remaining portions of the at least one electrically conductive material have top surfaces below a horizontal plane including the top surfaces of the upper dielectric matrix layer 66. Each remaining portion of the at least one electrically conductive material that fills a respective upper gate contact cavity 69 comprises a combination of an upper gate electrode extension 60E and an upper gate electrode contact pad 60P. Each upper gate electrode extension 60E may contact a respective one of the upper gate electrode line 60.

Figure 25:
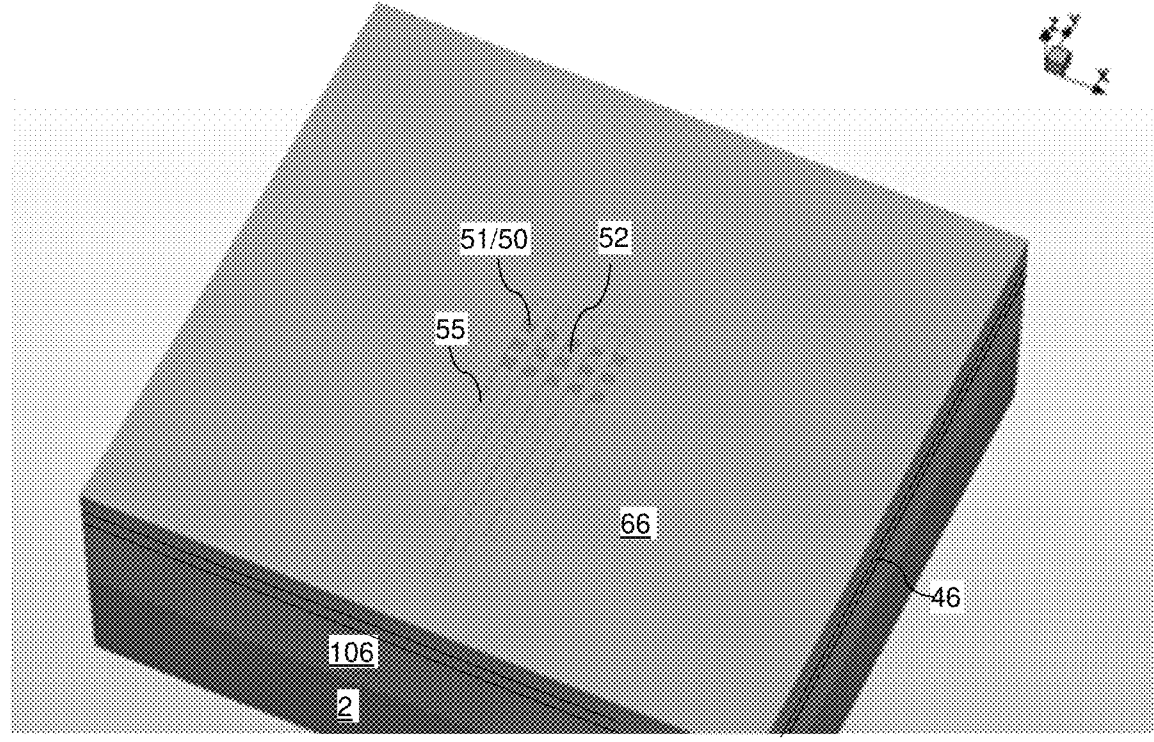
FIG. 25 is a perspective view of the exemplary structure after formation of lower dielectric capping material portions according to an embodiment of the present disclosure.

Referring to FIG. 25, a dielectric fill material can be deposited in remaining volumes of the upper gate contact cavities 69. Excess portions of the dielectric fill material can be removed from above the horizontal plane including the top surface of the upper dielectric matrix layer 66. Remaining portions of the dielectric fill material can be incorporated into the upper dielectric matrix layer 66, and can cover the upper gate electrode extensions 60E and the upper gate electrode contact pads 60P.

Figure 26A:
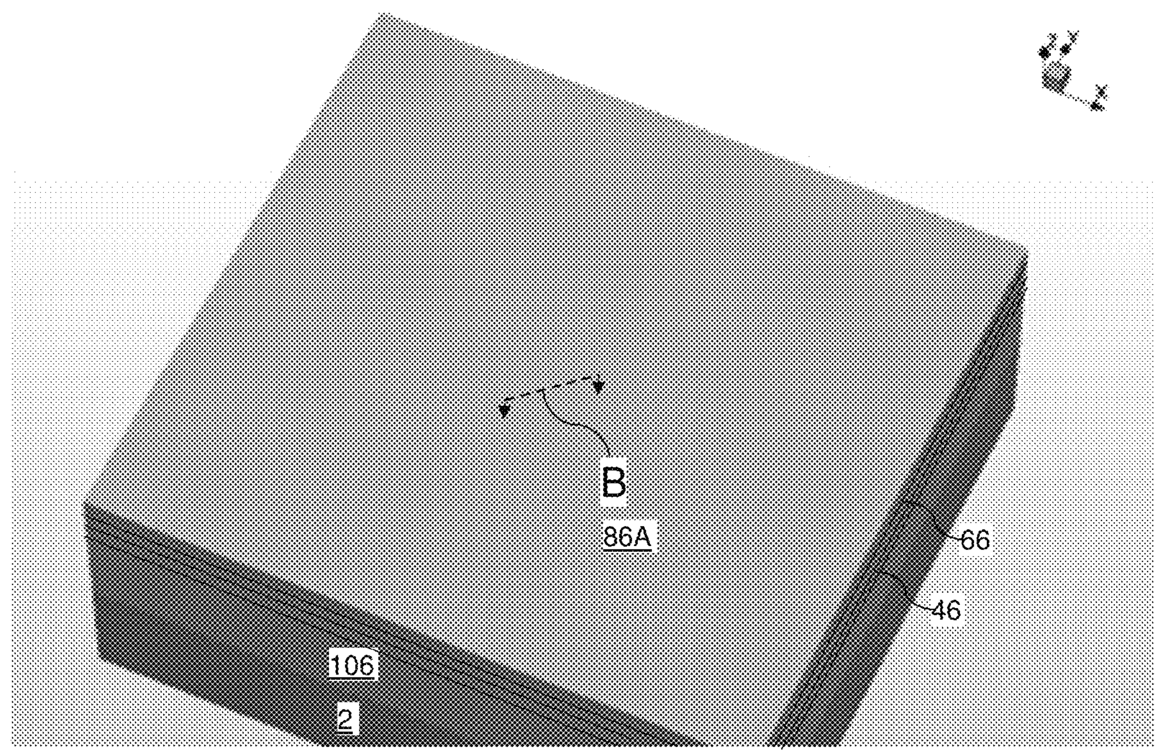
FIG. 26A is a perspective view of the exemplary structure after formation of a capping dielectric matrix layer according to an embodiment of the present disclosure.
Figure 26B:
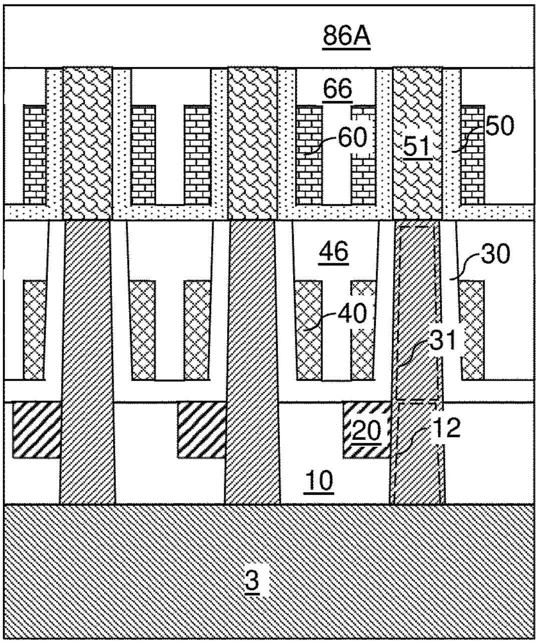
FIG. 26B is a vertical cross-sectional view of a region of the first exemplary structure along the vertical cut plane B of FIG. 26A.

Referring to FIGS. 26A and 26B, a dielectric material, such as silicate glass, can be deposited over the upper dielectric matrix layer 66 to form a capping dielectric matrix layer 86A. In an alternative embodiment, the processing steps of FIGS. 25, 26A, and 26B may comprise a single dielectric material deposition step. The thickness of the capping dielectric matrix layer 86A may be in a range from 200 nm to 1,000 nm, although lesser and greater thicknesses may also be employed.

Figure 27A:
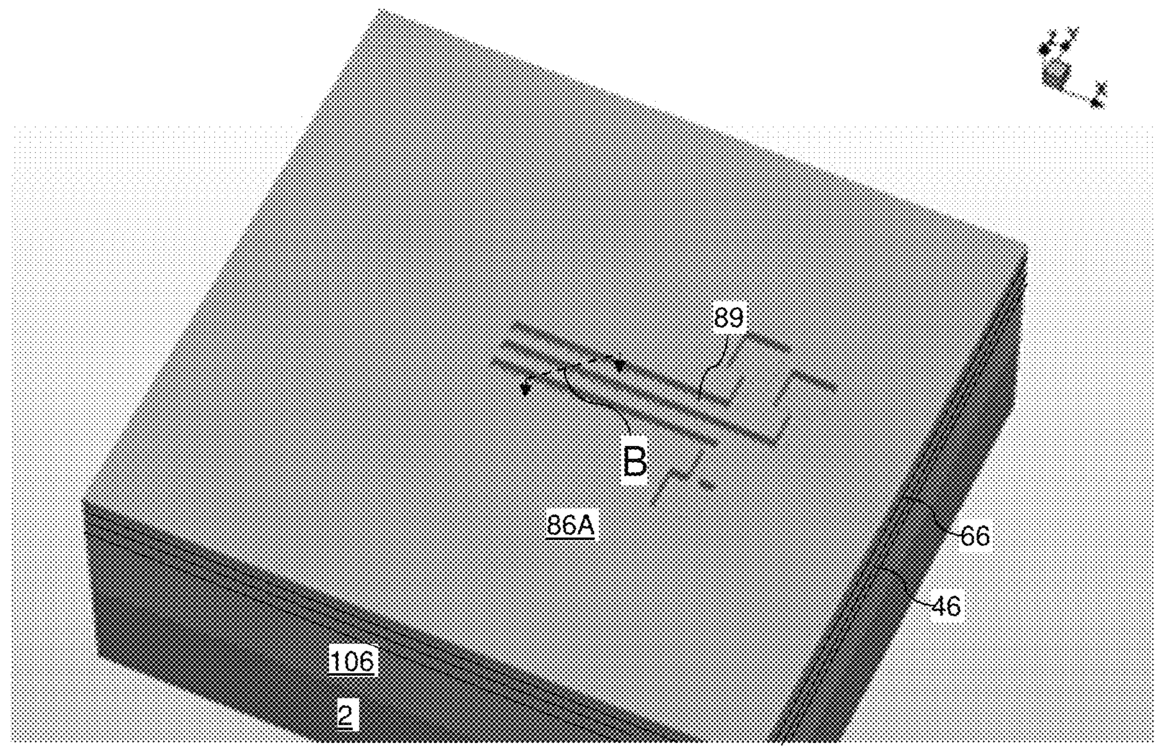
FIG. 27A is a perspective view of the exemplary structure after formation of top bit line cavities according to an embodiment of the present disclosure.
Figure 27B:
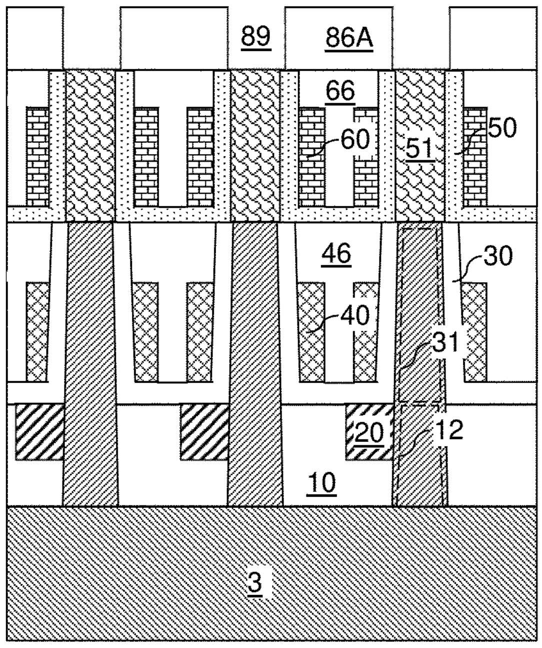
FIG. 27B is a vertical cross-sectional view of a region of the first exemplary structure along the vertical cut plane B of FIG. 27A.

Referring to FIGS. 27A and 27B, a photoresist layer (not shown) can be applied over the capping dielectric matrix layer 86A, and can be lithographically patterned to form a pattern of openings. The pattern of openings include elongated line-shaped openings having a respective end portion that is connected to a respective pad-shaped opening. Each of the elongated line-shaped openings can have an areal overlap with a respective row of upper semiconductor pillars 51 arranged along the first horizontal direction. Each of the pad-shaped openings may have an areal overlap with the underlying dielectric material portion 106. An anisotropic etch process can be performed to transfer the pattern of the openings in the photoresist layer into the capping dielectric matrix layer 86A. Top-level trenches 89 are formed in the capping dielectric matrix layer 86A within volumes from which material of the capping dielectric matrix layer 86A is removed. The photoresist layer can be subsequently removed, for example, by ashing.

Figure 28A:
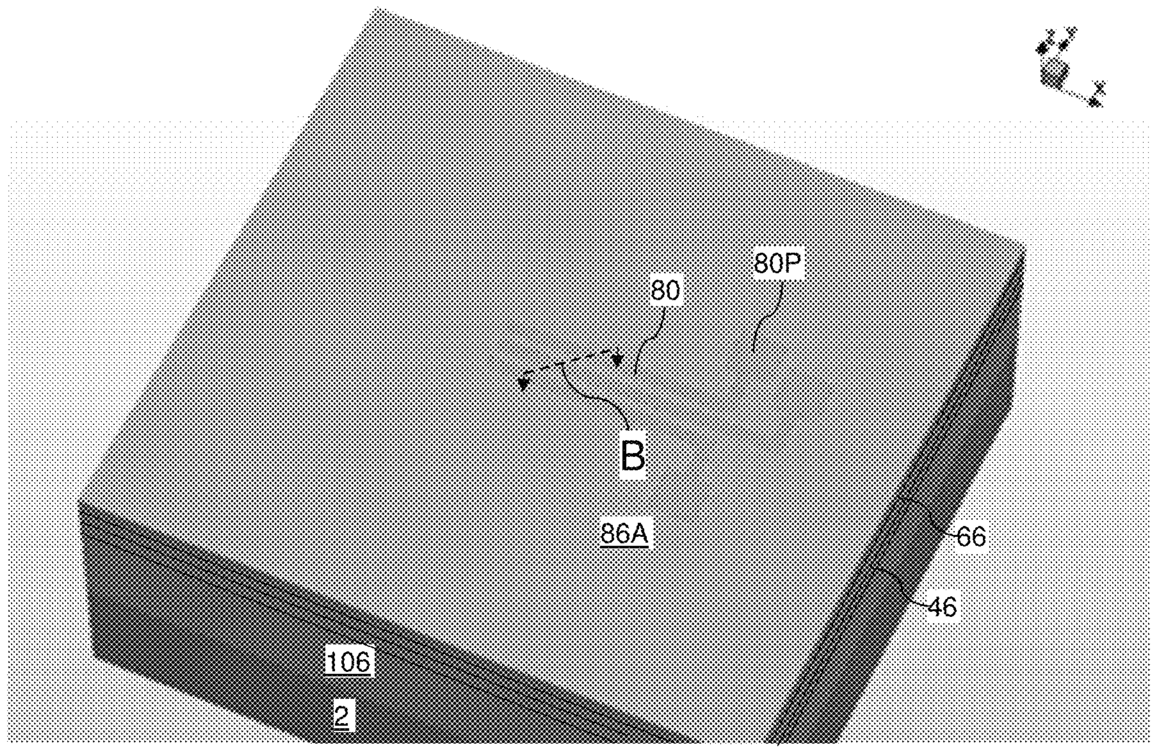
FIG. 28A is a perspective view of the exemplary structure after formation of top bit lines according to an embodiment of the present disclosure.
Figure 28B:
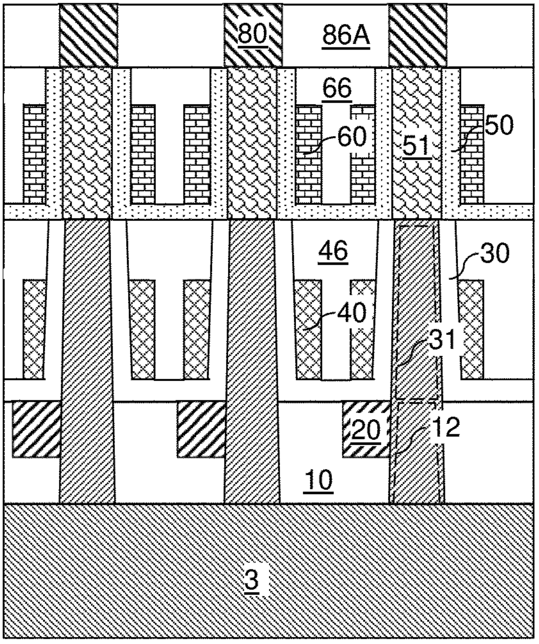
FIG. 28B is a vertical cross-sectional view of a region of the first exemplary structure along the vertical cut plane B of FIG. 28A.

Referring to FIGS. 28A and 28B, at least one electrically conductive material can be deposited in the top-level trenches 89. The at least one electrically conductive material may comprise a combination of a metallic barrier material (such as TiN, TaN, WN, and/or MoN) and a metal fill material (such as W, Co, Ru, Mo, Ti, Ta, etc.). The at least one electrically conductive material can fill the entire volume of the top-level trenches 89. A horizontally-extending portion of the at least one electrically conductive material overlies the top surface of the capping dielectric matrix layer 86A. A recess etch process or a chemical mechanical polishing process can be performed to remove the horizontally-extending portion of the at least one electrically conductive material from above the horizontal plane including the top surfaces of the capping dielectric matrix layer 86A.

Each contiguous remaining portion of the at least one electrically conductive material fills a top-level trenches 89, and constitute a combination of a top bit line 80 and a top bit line contact pad 80P. Each top bit line 80 contacts top surfaces of a respective row of upper semiconductor pillars 51 that are arranged along the first horizontal direction (such as the x-direction), and is adjoined to a respective one of the top bit line contact pads 80P. The lateral dimensions of the top bit line contact pads 80P can be greater than lateral dimensions of connection via structures to be subsequently formed through a lower portion of the dielectric material portion 106. For example, the top bit line contact pads 80P may have lateral dimensions in a range from 300 nm to 3 microns. Each top bit line 80 can be embedded within the capping dielectric matrix layer 86A.

Figure 29A:
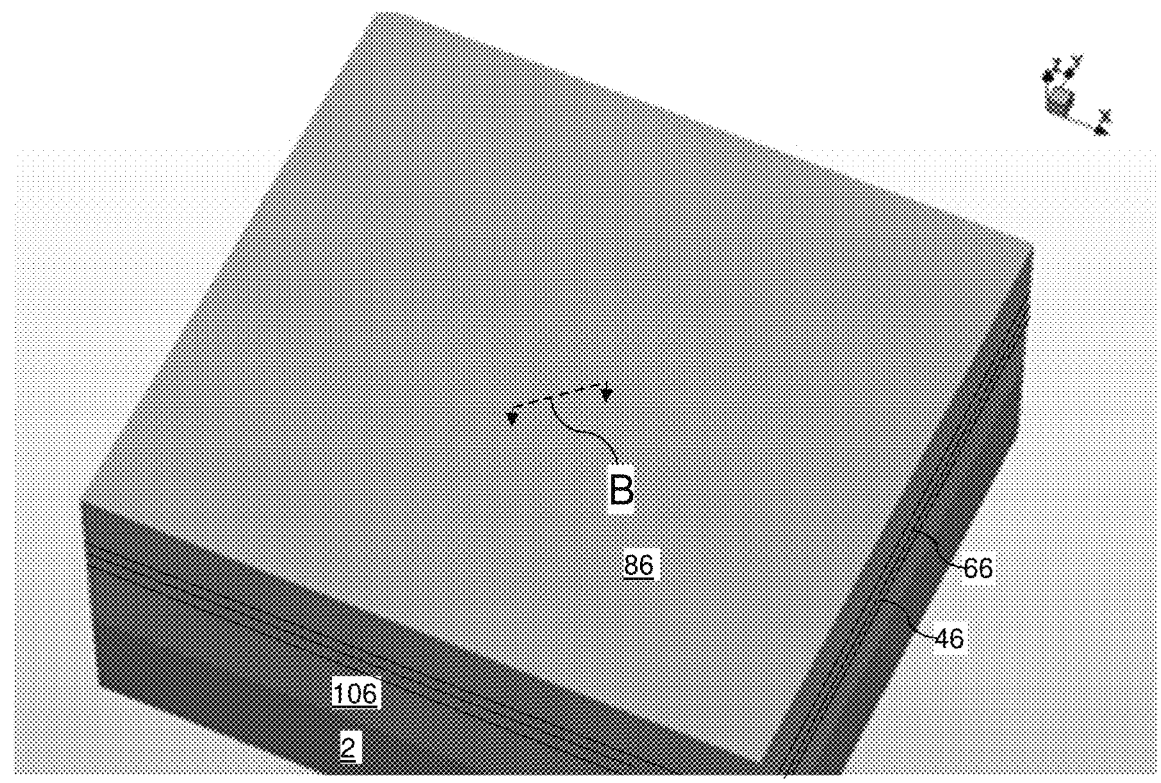
FIG. 29A is a perspective view of the exemplary structure after depositing an additional dielectric material layer according to an embodiment of the present disclosure.
Figure 29B:
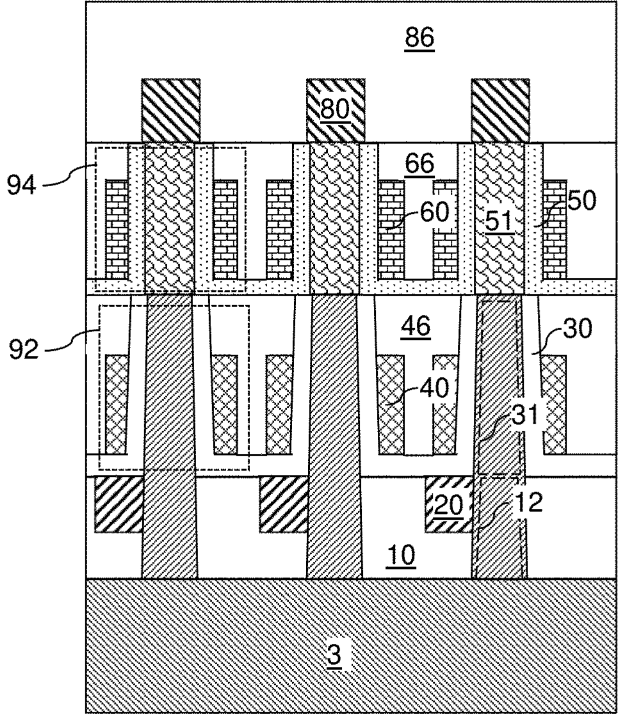
FIG. 29B is a vertical cross-sectional view of a region of the first exemplary structure along the vertical cut plane B of FIG. 29A.

Referring to FIGS. 29A and 29B, an additional dielectric material layer can be formed over the capping dielectric matrix layer 86A. The combination of the capping dielectric matrix layer 86A and the additional dielectric material layer is herein referred to as upper dielectric material layers 86.

Referring to FIG. 29B, an upper field effect transistor 94 is located on the lower field effect transistor 92. Each of the lower field effect transistor 92 includes a lower semiconductor pillar 31 which functions as a channel, the lower gate dielectric layer 30 which functions as the gate insulating layer, and dual lower gate lines 40 which function as dual gate electrodes. Each of the upper field effect transistors 94 includes an upper semiconductor pillar 51 which functions as a channel, the upper dielectric layer 50 which functions as the gate insulating layer, and dual upper gate lines 60 which function as dual gate electrodes. The lower semiconductor pillar 31 is electrically connected to the upper semiconductor pillar 51 such that the channels of the lower and upper field effect transistors are electrically connected. The bottom bit line 20 acts as a common drain electrode and the top bit line 80 acts as a common source electrode for both transistors (92, 94). In an alternative embodiment, rather than forming separate top bit lines 80, a common plate shaped top bit line which functions as a common source line may be formed in contact with all upper semiconductor pillars 51 of the array. In this alternative embodiment, the upper field effect transistor 94 functions as the access transistor, and the lower field effect transistor 92 functions as memory transistor.

Figure 30:
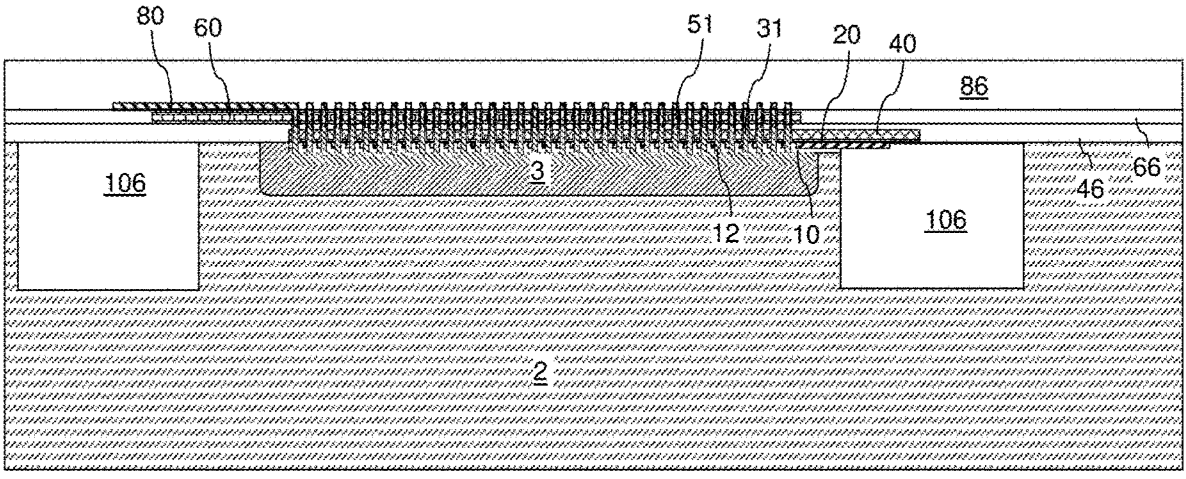
FIG. 30 is a vertical cross-sectional view of the exemplary structure after the processing steps of FIGS. 29A and 29B.

Referring to FIG. 30, the exemplary structure after the processing steps of FIGS. 29A and 29B is illustrated in a vertical cross-sectional view along the second horizontal direction (e.g., the y-direction, which corresponds to the word line direction). The lower gate electrode 40 may comprise a lower word line, and the upper gate electrode 60 may comprise an upper word line.

Figure 31A:
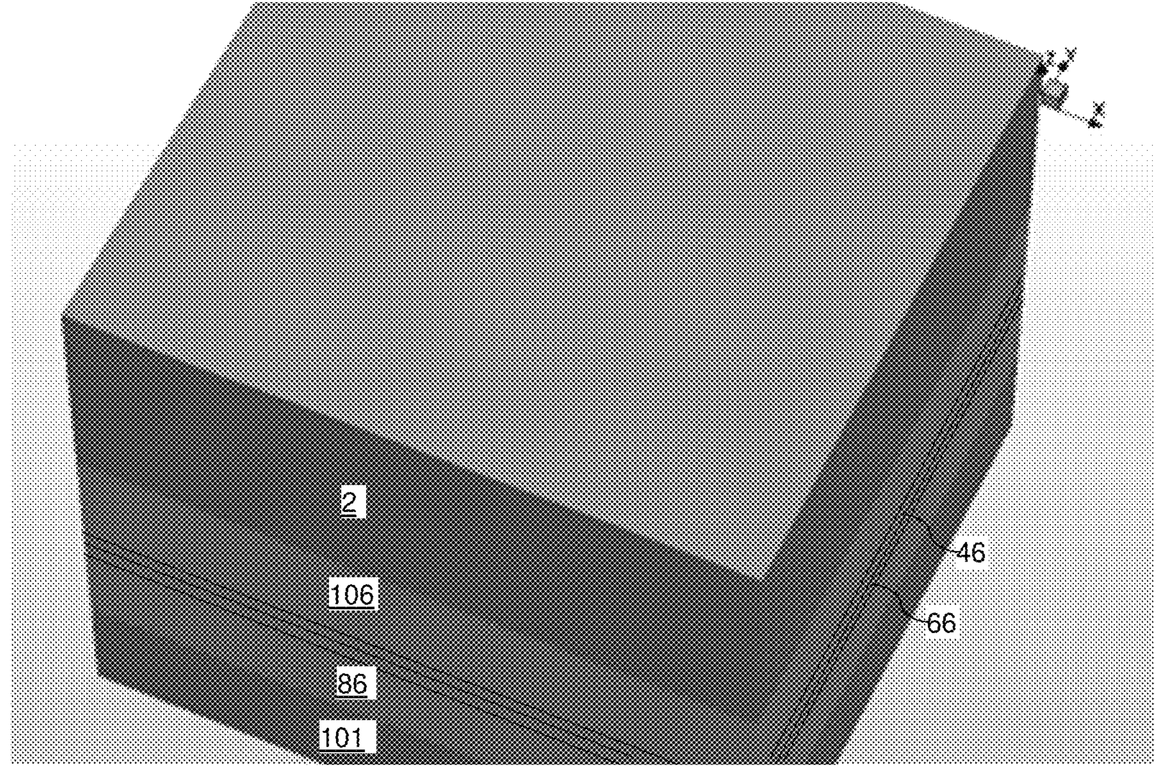
FIG. 31A is a perspective view of the exemplary structure after attaching a carrier wafer to upper dielectric material layers and flipping the exemplary structure upside down according to an aspect of the present disclosure.
Figure 31B:
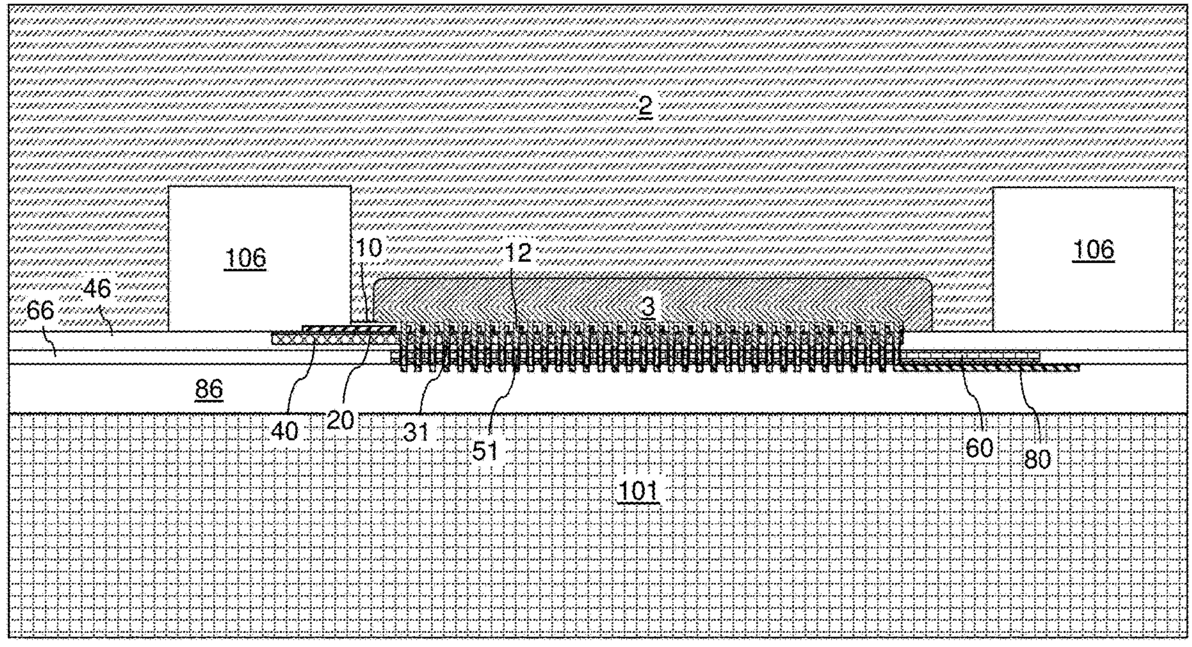
FIG. 31B is a vertical cross-sectional view of the exemplary structure of FIG. 31A.

Referring to FIGS. 31A and 31B, a carrier substrate 101 can be attached to the upper dielectric material layers 86. The carrier substrate 101 may comprise any substrate that can be employed to provide structural support to the combination of the semiconductor substrate 2, the dielectric material portion 106, and the various structures formed thereupon during the processing steps described with reference to FIG. 3A-30 during a subsequent backside thinning process. For example, the carrier substrate 101 may comprise a glass substrate.

Figure 32A:
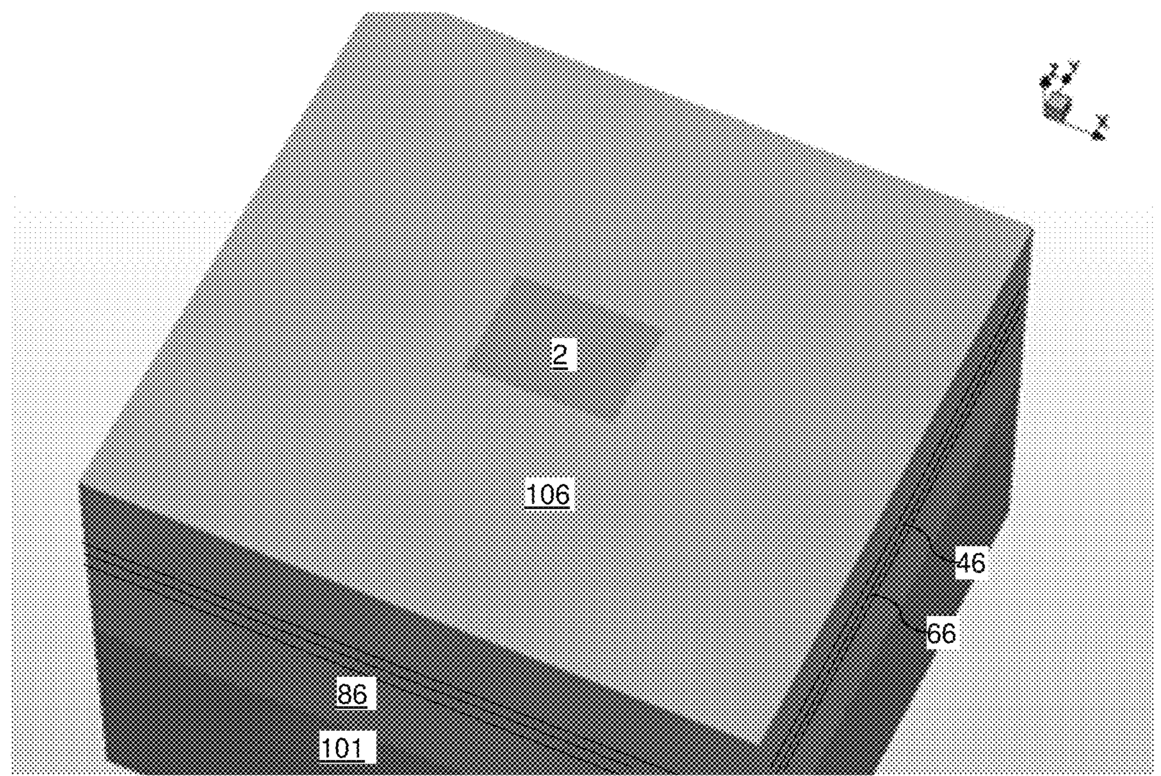
FIG. 32A is a perspective view of the exemplary structure after thinning the substrate including the semiconductor material layer according to an embodiment of the present disclosure.
Figure 32B:
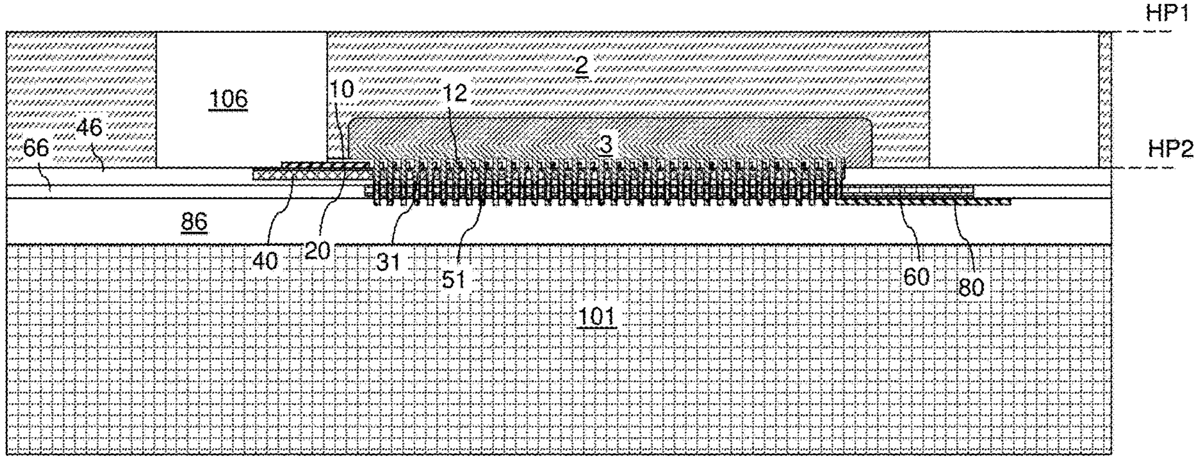
FIG. 32B is a vertical cross-sectional view of the exemplary structure of FIG. 32A.

Referring to FIGS. 32A and 32B, the semiconductor substrate 2 can be thinned from the backside by performing at least one thinning process, which may employ grinding, polishing, at least one anisotropic etch process, and/or at least one isotropic etch process. The backside surface of the dielectric material portion 106 may be physically exposed upon thinning the backside of the semiconductor substrate 2 to provide a thinned, composite substrate (2, 3, 106). The backside surface of the composite substrate (2, 3, 106) may be formed in a first horizontal plane HP1. The front surface of the composite substrate (2, 3, 106) may be located within a second horizontal plane HP2. The thickness of the composite substrate (2, 3, 106) may be in a range from 80 nm to 4,000 nm, such as from 200 nm to 2,000 nm, although lesser and greater thicknesses may also be employed. The exemplary structure may be flipped upside down afterwards. Generally, the dielectric material portion 106 is located on at least one sidewall of the semiconductor substrate 2 and may laterally surround a portion of the semiconductor substrate 2 located in a memory array region.

Figure 33A:
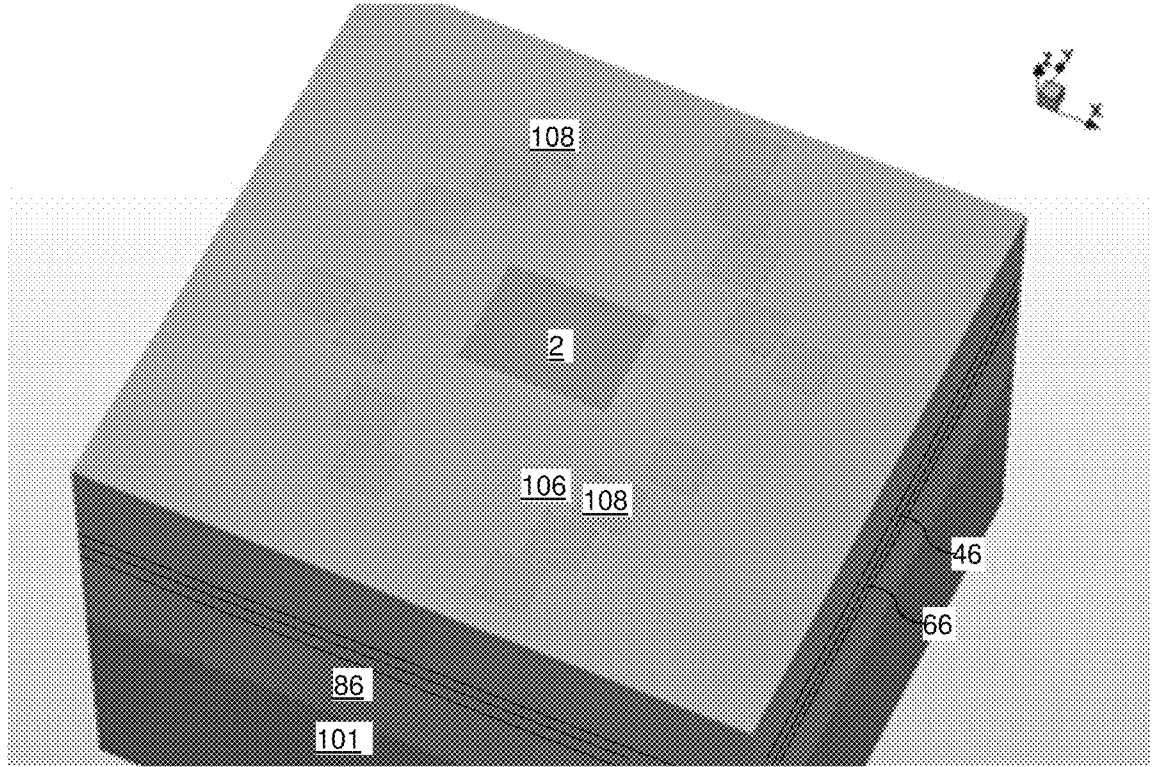
FIG. 33A is a perspective view of the exemplary structure after formation of connection via structures according to an embodiment of the present disclosure.
Figure 33B:
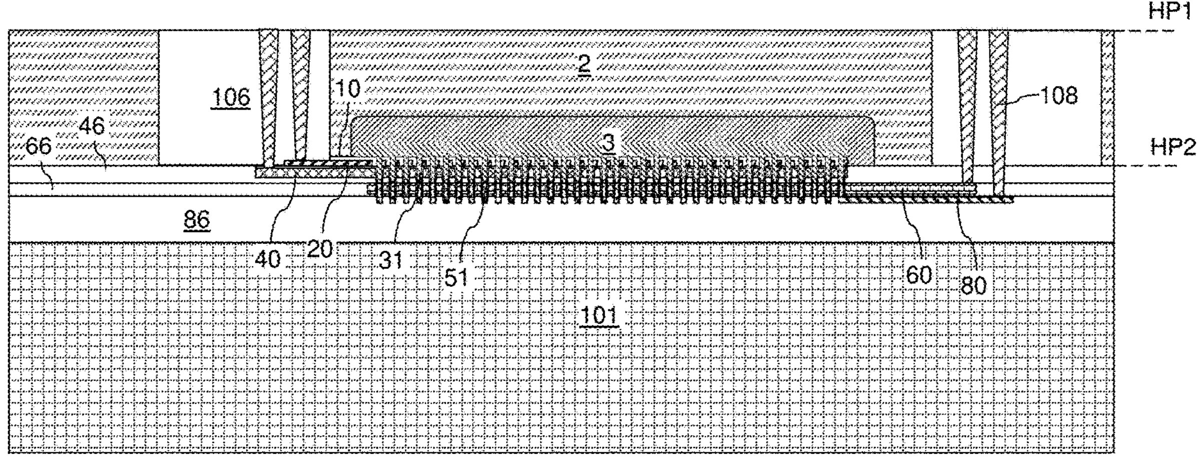
FIG. 33B is a vertical cross-sectional view of the exemplary structure of FIG. 33A.
Figure 33C:
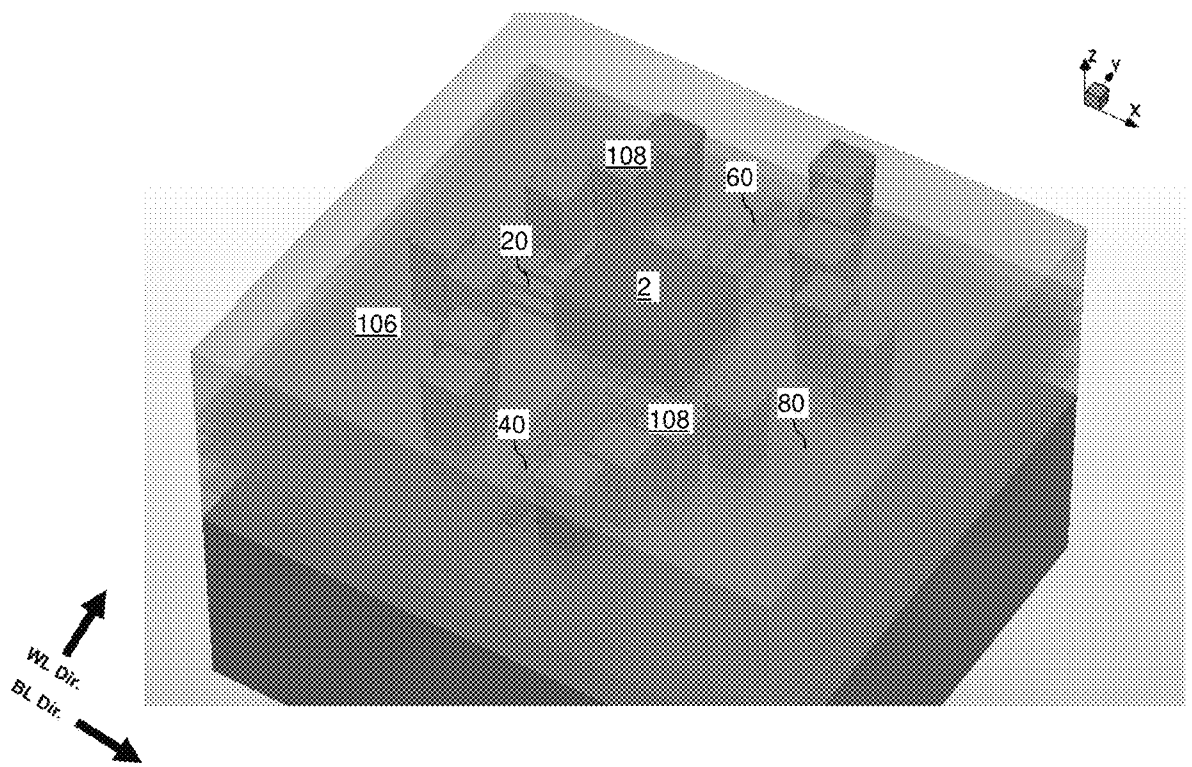
FIG. 33C is a perspective see-through view of the exemplary structure of FIGS. 33A and 33B.

Referring to FIGS. 33A and 33B, connection via structures 108 can be formed through the dielectric material portion 106, the lower dielectric matrix layer 46, and the upper dielectric matrix layer 66 and directly on backside surfaces of the various contact pads (20P, 40P, 60P, 80P). The various contacts pads (20P, 40P, 60P, 80P) include bottom bit line contact pads 20P, lower gate electrode contact pads 40P, upper gate electrode contact pads 60P, and top bit line contact pads 80P.

Figure 34:
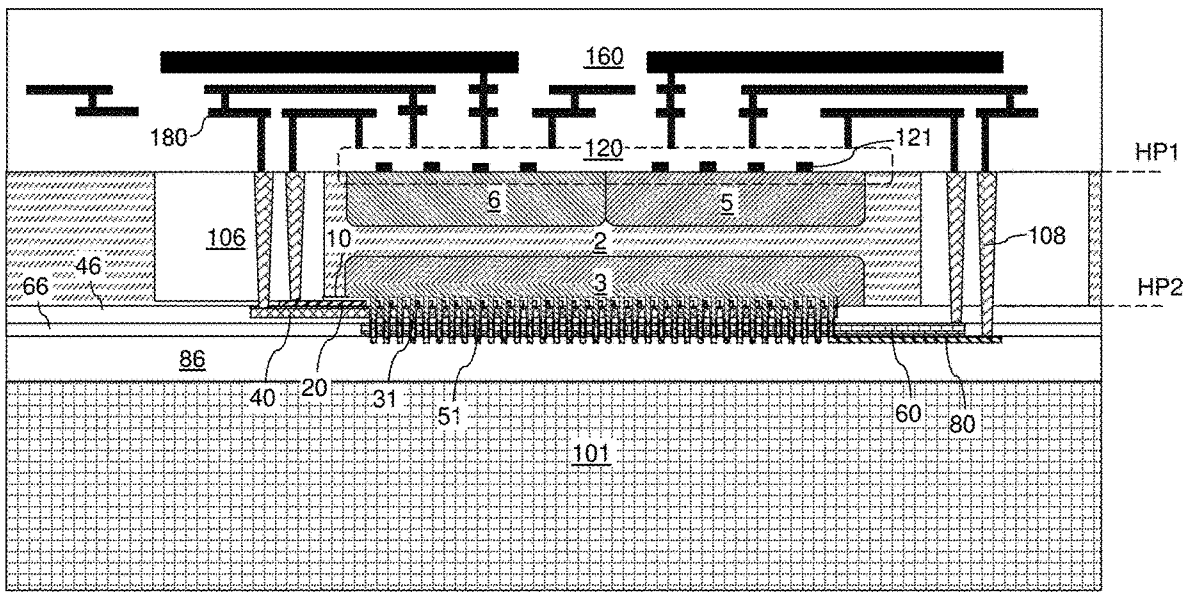
FIG. 34 is a vertical cross-sectional view of the exemplary structure after formation of backside metal interconnect structures embedded in backside dielectric layers according to an embodiment of the present disclosure.

Referring to FIG. 34, various doped semiconductor wells (5, 6) can be formed under the backside surface of the semiconductor substrate 2 by introducing (e.g., implanting) electrical dopants into backside surface portions of the semiconductor substrate 2 using one or more masked ion implantation steps. The doped semiconductor wells (5, 6) may comprise p-type wells 5 and n-type wells 6. Various semiconductor devices including field effect transistors 120 can be formed on the backside surface of the semiconductor substrate 2. The field effect transistors 120 comprise peripheral (e.g., driver) circuit transistors for the memory transistors. In some embodiments, gate electrodes 121 of the field effect transistors 120 may be form on an opposite side of the semiconductor pillars (31, 51) relative to the semiconductor substrate 2. In this case, the gate electrodes 121 of the field effect transistors 120 may be more distal from the bottom bit lines 20 than the backside surface of the semiconductor substrate 2 (which is contained within the first horizontal plane HP1) is from the bottom bit lines 20.

Backside metal interconnect structures 180 embedded in backside dielectric layers 160 can be formed such that electrical nodes (e.g., gate electrodes 121, source regions and drain regions) of the field effect transistors 120 are electrically connected to a respective one of the bottom bit lines 20, the lower gate electrode lines 40, the upper gate electrode lines 60, and the top bit lines 80 through the backside metal interconnect structures 180 and the connection via structures 108.

Figure 35:
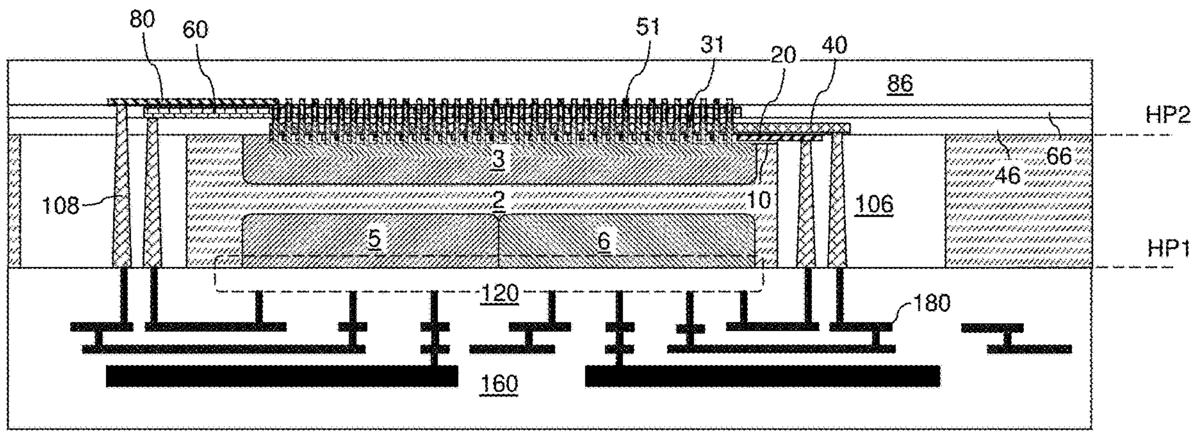
FIG. 35 is a vertical cross-sectional view of the exemplary structure after detaching the carrier wafer according to an embodiment of the present disclosure.

Referring to FIG. 35, the carrier substrate 101 may be detached from the assembly including the composite substrate (2, 3, 106), the memory array located on the front side of the composite substrate (2, 3, 106), and the backside metal interconnect structures 180 embedded in backside dielectric layers 160. The exemplary structure is flipped again so that the front side of the composite substrate (2, 3, 106) faces upward in FIG. 35.

Referring to all drawings and according to various embodiments of the present disclosure, a device structure is provided, which comprises: base semiconductor rail structures 12 overlying a semiconductor substrate 2; bottom bit lines 20 contacting a sidewall of a respective one of the base semiconductor rail structures 12; a two-dimensional array of lower semiconductor pillars 31, wherein each row of the lower semiconductor pillars 31 overlies and is adjoined to a respective one of the base semiconductor rail structures 12; lower gate electrode lines 40 overlying the bottom bit lines 20 and laterally spaced from sidewall segments of a respective column of the lower semiconductor pillars 31 by a lower gate dielectric layer 30; a two-dimensional array of upper semiconductor pillars 51, wherein each of the upper semiconductor pillars 51 contacts a top surface of a respective one of the lower semiconductor pillars 31; upper gate electrode lines 60 overlying the lower gate electrode lines 40 and laterally spaced from sidewall segments of a respective column of the upper semiconductor pillars 51 by an upper gate dielectric layer 50; and at least one top bit line 80 contacting top surfaces of a respective row of upper semiconductor pillars 51.

In one embodiment, one of the lower gate dielectric layer 30 and the upper gate dielectric layer 50 comprises a non-volatile memory material, and another one of the lower gate dielectric layer 30 and the upper gate dielectric layer 50 is free of any memory material. In one embodiment, the non-volatile memory material comprises a ferroelectric dielectric material, while the other gate dielectric layer comprises silicon oxide.

In one embodiment, the device structure comprises a base dielectric layer 10 laterally surrounding the base semiconductor rail structures 12, embedding the bottom bit lines 20, and overlying the semiconductor substrate 2. In one embodiment, the bottom bit lines 20 are vertically spaced from the semiconductor substrate 2 by a horizontally-extending portion of the base dielectric layer 10.

In one embodiment, the semiconductor substrate 2 comprises a semiconductor material layer 3 including a first single crystalline semiconductor material; and each of the lower semiconductor pillars 31 comprises a respective portion of a second single crystalline semiconductor material that is epitaxially aligned to the first single crystalline semiconductor material. In one embodiment, the semiconductor material layer 3 has a doping of a first conductivity type; and the lower semiconductor pillars 31 have a doping of a second conductivity type that is an opposite of the first conductivity type. In one embodiment, the upper semiconductor pillars 51 comprise a polycrystalline semiconductor material.

In one embodiment, the lower gate dielectric layer 30 comprises a horizontally-extending portion and vertically-extending portions that are adjoined to, and protrude upward from, the horizontally-extending portion. In one embodiment, top surface segments of the vertically-extending portions of the lower gate dielectric layer 30 contact a bottom surface of a horizontally-extending portion of the upper gate dielectric layer 50.

In one embodiment, the device structure comprises a two-dimensional array of first dielectric pillars 32 interlaced with the two-dimensional array of lower semiconductor pillars 31, wherein the lower gate dielectric layer 30 laterally contacts a respective column of first dielectric pillars 32 within the two-dimensional array of first dielectric pillars 32. In one embodiment, the device structure comprises a two-dimensional array of second dielectric pillars 52 interlaced with the two-dimensional array of upper semiconductor pillars 51, wherein the upper gate dielectric layer 50 laterally contacts a respective column of second dielectric pillars 52 within the two-dimensional array of second dielectric pillars 52.

In one embodiment, each of the lower semiconductor pillars 31 comprises a first pillar sidewall and a second pillar sidewall that are laterally spaced from each other; the first pillar sidewall contacts an inner sidewall of a first vertically-extending portion of the lower gate dielectric layer 30; the second pillar sidewall contacts an inner sidewall of a second vertically-extending portion of the lower gate dielectric layer 30; a first horizontally-extending portion of one of the lower gate electrode lines 40 contacts an outer sidewall of the first vertically-extending portion of the lower gate dielectric layer 30; and a second horizontally-extending portion of said one of the lower gate electrode lines 40 contacts an outer sidewall of the second vertically-extending portion of the lower gate dielectric layer 30.

In one embodiment, the device structure further comprises peripheral field effect transistors 120 located on a backside surface of the semiconductor substrate 2, a dielectric material portion 106 in contact with a sidewall of the semiconductor substrate 2 and vertically extending through an entire thickness of the semiconductor substrate 2; connection via structures 108 vertically extending through the dielectric material portion 106; and backside metal interconnect structures 180 embedded in backside dielectric layers 160. Electrical nodes (source regions and/or drain regions) of the peripheral field effect transistors 120 are electrically connected to a respective one of the bottom bit lines 20, the lower gate electrode lines 40, the upper gate electrode lines 60, and the at least one top bit line 80.

According to another aspect of the present disclosure shown in FIG. 29B, a device structure comprises a semiconductor substrate 2 comprising a frontside surface and a backside surface; a lower field effect transistor 92 located over the frontside surface of the semiconductor substrate 2, and comprising a lower vertical semiconductor channel 31, at least one lower gate electrode 40 and a lower gate dielectric layer 30 located between a sidewall of the lower vertical semiconductor channel 31 and a sidewall of the at least one lower gate electrode 40; and an upper field effect transistor 94 located over the lower field effect transistor 92, and comprising an upper vertical semiconductor channel 51, at least one upper gate electrode 60 and an upper gate dielectric layer 50 located between a sidewall of the upper vertical semiconductor channel 51 and a sidewall of the at least one upper gate electrode 60. The lower vertical semiconductor channel 31 is electrically connected to (e.g., physically contacts) the upper vertical semiconductor channel 51; one of the lower gate dielectric layer 30 and the upper gate dielectric layer 50 comprises a non-volatile memory material; and another one of the lower gate dielectric layer 30 and the upper gate dielectric layer 50 is free of any memory material.

In one embodiment, one of the field effect transistors (92, 94) comprises a memory transistor, such as a FeFET, and the other one of the field effect transistors (92, 94) comprises an access transistor.

The embodiments of the present disclosure provide a non-volatile memory array that integrates memory and access transistors along a vertical direction. This architecture utilizes a two-transistor zero-capacitor (2T0C) memory unit comprising a vertical MOS access transistor and a vertical ferroelectric memory transistor. The ferroelectric memory transistor stores data by modulating its threshold voltage via ferroelectric material polarization states. The transistors integrated into the array using connection via structures extending through a dielectric material portion that laterally surrounds a semiconductor substrate. This integration scheme facilitates the seamless incorporation of peripheral CMOS circuitry in a same semiconductor die, effectively reducing area constraints and optimizing peripheral performance while maintaining a compact memory array structure.

Moreover, the disclosed architecture incorporates an accessible p-well for body biasing of the memory array, further enhancing control over memory cell operations, thus improving both efficiency and reliability. Any type of non-volatile memory material may be employed for one of the lower gate dielectric layer 30 and the upper gate dielectric layer 50. In one embodiment, the polarization states of a ferroelectric material may be employed as a storage mechanism in a NAND-like memory configuration. This integration of a non-volatile memory transistors with peripheral CMOS transistors results in a high-performance, scalable memory that addresses the limitations of traditional two-dimensional (2D) architectures, thereby meeting the growing demands for higher density and enhanced performance in memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph or in different paragraphs, a Markush group including a listing of the two or more elements is also impliedly Disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or magnetic configuration is illustrated in the present disclosure, it is understood that the present disclosure may be practiced with any other compatible structures and/or magnetic configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A device structure, comprising:

base semiconductor rail structures overlying a semiconductor substrate;

bottom bit lines contacting a sidewall of a respective one of the base semiconductor rail structures;

a two-dimensional array of lower semiconductor pillars, wherein each row of the lower semiconductor pillars overlies and is adjoined to a respective one of the base semiconductor rail structures;

lower gate electrode lines overlying the bottom bit lines and laterally spaced from sidewall segments of a respective column of the lower semiconductor pillars by a lower gate dielectric layer;

a two-dimensional array of upper semiconductor pillars, wherein each of the upper semiconductor pillars contacts a top surface of a respective one of the lower semiconductor pillars;

upper gate electrode lines overlying the lower gate electrode lines and laterally spaced from sidewall segments of a respective column of the upper semiconductor pillars by an upper gate dielectric layer; and at least one top bit line contacting top surfaces of a respective row of upper semiconductor pillars.

2. The device structure of claim 1, wherein:

one of the lower gate dielectric layer and the upper gate dielectric layer comprises a non-volatile memory material; and another one of the lower gate dielectric layer and the upper gate dielectric layer is free of any memory material.

3. The device structure of claim 2, wherein the non-volatile memory material comprises a ferroelectric dielectric material.

4. The device structure of claim 1, further comprising a base dielectric layer laterally surrounding the base semiconductor rail structures, embedding the bottom bit lines, and overlying the semiconductor substrate, wherein the bottom bit lines are vertically spaced from the semiconductor substrate by a horizontally-extending portion of the base dielectric layer.

5. The device structure of claim 1, wherein:

the semiconductor substrate comprises a semiconductor material layer including a first single crystalline semiconductor material;

each of the lower semiconductor pillars comprises a respective portion of a second single crystalline semiconductor material that is epitaxially aligned to the first single crystalline semiconductor material; and the upper semiconductor pillars comprise a polycrystalline semiconductor material.

6. The device structure of claim 1, wherein:

the lower gate dielectric layer comprises a horizontally-extending portion and vertically-extending portions that are adjoined to and protrude upward from the horizontally-extending portion; and top surface segments of the vertically-extending portions of the lower gate dielectric layer contact a bottom surface of a horizontally-extending portion of the upper gate dielectric layer.

7. The device structure of claim 1, further comprising:

a two-dimensional array of first dielectric pillars interlaced with the two-dimensional array of lower semiconductor pillars, wherein the lower gate dielectric layer laterally contacts a respective column of first dielectric pillars within the two-dimensional array of first dielectric pillars; and a two-dimensional array of second dielectric pillars interlaced with the two-dimensional array of upper semiconductor pillars, wherein the upper gate dielectric layer laterally contacts a respective column of second dielectric pillars within the two-dimensional array of second dielectric pillars.

8. The device structure of claim 1, wherein:

each of the lower semiconductor pillars comprises a first pillar sidewall and a second pillar sidewall that are laterally spaced from each other;

the first pillar sidewall contacts an inner sidewall of a first vertically-extending portion of the lower gate dielectric layer;

the second pillar sidewall contacts an inner sidewall of a second vertically-extending portion of the lower gate dielectric layer;

a first horizontally-extending portion of one of the lower gate electrode lines contacts an outer sidewall of the first vertically-extending portion of the lower gate dielectric layer; and a second horizontally-extending portion of said one of the lower gate electrode lines contacts an outer sidewall of the second vertically-extending portion of the lower gate dielectric layer.

9. The device structure of claim 1, further comprising:

a peripheral circuit comprising peripheral field effect transistors located on a backside surface of the semiconductor substrate;

a dielectric material portion in contact with a sidewall of the semiconductor substrate and vertically extending through an entire thickness of the semiconductor substrate;

connection via structures vertically extending through the dielectric material portion; and backside metal interconnect structures embedded in backside dielectric layers, wherein electrical nodes of the peripheral field effect transistors are electrically connected to a respective one of the bottom bit lines, the lower gate electrode lines, the upper gate electrode lines, and the at least one top bit line.

10. A device structure, comprising:

a semiconductor substrate comprising a frontside surface and a backside surface;

a lower field effect transistor located over the frontside surface of the semiconductor substrate, and comprising a lower vertical semiconductor channel, at least one lower gate electrode and a lower gate dielectric layer located between a sidewall of the lower vertical semiconductor channel and a sidewall of the at least one lower gate electrode; and an upper field effect transistor located over the lower field effect transistor, and comprising an upper vertical semiconductor channel, at least one upper gate electrode and an upper gate dielectric layer located between a sidewall of the upper vertical semiconductor channel and a sidewall of the at least one upper gate electrode, wherein:

the lower vertical semiconductor channel is electrically connected to the upper vertical semiconductor channel;

one of the lower gate dielectric layer and the upper gate dielectric layer comprises a non-volatile memory material; and another one of the lower gate dielectric layer and the upper gate dielectric layer is free of any memory material.

11. The device structure of claim 10, wherein:

the lower gate dielectric layer comprises the non-volatile memory material;

the upper gate dielectric layer is free of any memory material;

the lower field effect transistor comprises a memory transistor; and the upper field effect transistor comprises an access transistor.

12. The device structure of claim 11, wherein:

the lower gate dielectric layer comprises a ferroelectric dielectric material; and the upper gate dielectric layer comprises silicon oxide.

13. The device structure of claim 10, wherein:

the upper gate dielectric layer comprises the non-volatile memory material;

the lower gate dielectric layer is free of any memory material;

the upper field effect transistor comprises a memory transistor; and the lower field effect transistor comprises an access transistor.

14. The device structure of claim 10, further comprising:

a bottom bit line electrically connected to the lower vertical semiconductor channel; and a top bit line electrically connected to the upper vertical semiconductor channel.

15. The device structure of claim 10, further comprising:

a peripheral circuit comprising peripheral field effect transistors located on the backside surface of the semiconductor substrate;

a dielectric material portion in contact with a sidewall of the semiconductor substrate and vertically extending through an entire thickness of the semiconductor substrate;

connection via structures vertically extending through the dielectric material portion; and backside metal interconnect structures embedded in backside dielectric layers, wherein electrical nodes of the peripheral field effect transistors are electrically connected to a respective one of the bottom bit line, the lower gate electrode, the upper gate electrode, and the top bit line.

16. A method of forming a device structure, comprising:

forming a combination of bottom bit lines, base semiconductor rail structures, and a two-dimensional array of lower semiconductor pillars on a semiconductor substrate, wherein each row of the lower semiconductor pillars overlies and is adjoined to a respective one of the base semiconductor rail structures, and wherein each of the bottom bit lines contacts a respective one of the base semiconductor rail structures;

forming a lower gate dielectric layer on sidewall segments of the lower semiconductor pillars;

forming lower gate electrode lines, wherein each of the lower gate electrode lines is laterally spaced from a respective column of the lower semiconductor pillars by a lower gate dielectric layer;

forming a two-dimensional array of upper semiconductor pillars, wherein each of the upper semiconductor pillars is formed directly on a top surface of a respective one of the lower semiconductor pillars;

forming an upper gate dielectric layer on sidewall segments of the upper semiconductor pillars;

forming upper gate electrode lines, wherein each of the upper gate electrode lines is laterally spaced from a respective column of the upper semiconductor pillars by an upper gate dielectric layer; and forming at least one top bit line on top surfaces of a respective row of upper semiconductor pillars.

17. The method of claim 16, wherein one of the lower gate dielectric layer and the upper gate dielectric layer comprises a non-volatile memory material.

18. The method of claim 17, wherein another of the lower gate dielectric layer and the upper gate dielectric layer is free of any memory material.

19. The method of claim 16, further comprising forming peripheral field effect transistors on a backside surface of the semiconductor substrate.

20. The method of claim 19, further comprising:

forming a dielectric material portion on a sidewall of the semiconductor substrate;

forming connection via structures through the dielectric material portion; and forming backside metal interconnect structures embedded in backside dielectric layers such that electrical nodes of the peripheral field effect transistors are electrically connected to a respective one of the bottom bit lines, the lower gate electrode lines, the upper gate electrode lines, and the at least one top bit line through the backside metal interconnect structures and the connection via structures.

* * * * *